United States Patent
Miyata

(10) Patent No.: US 7,094,440 B2
(45) Date of Patent: Aug. 22, 2006

(54) SUBSTRATE TREATMENT METHOD AND SUBSTRATE TREATMENT APPARATUS

(75) Inventor: Akira Miyata, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 316 days.

(21) Appl. No.: 10/347,438

(22) Filed: Jan. 21, 2003

(65) Prior Publication Data

US 2003/0138551 A1    Jul. 24, 2003

(30) Foreign Application Priority Data

Jan. 22, 2002  (JP)  ........................................ 2002-012805
Jan. 22, 2002  (JP)  ........................................ 2002-012810

(51) Int. Cl.
*B05C 11/10*    (2006.01)

(52) U.S. Cl. ............................ 427/9; 427/240; 118/698; 118/702; 118/703; 118/704

(58) Field of Classification Search ................. 118/696, 118/698, 699, 702, 703, 704; 239/65; 427/8, 427/9, 10
See application file for complete search history.

(56) References Cited

U.S. PATENT DOCUMENTS 5,089,305 A    2/1992    Ushijima et al.

6,541,063 B1 *  4/2003  Prentice et al. ................. 427/8

FOREIGN PATENT DOCUMENTS

| JP | 09-320958 | 12/1997 |
| JP | 10-032157 | 2/1998 |
| JP | 2000-195774 | 7/2000 |

OTHER PUBLICATIONS

Notification of Reason for Refusal, Dispatch No.: 144414, Dispatch Date: Apr. 26, 2005.

* cited by examiner

*Primary Examiner*—George Koch
(74) *Attorney, Agent, or Firm*—Rader, Fishman & Grauer PLLC

(57) ABSTRACT

The present invention is a substrate treatment method in which a treatment by supplying a treatment solution from a nozzle to a substrate is successively performed for a plurality of substrates, which comprises the step of, during the performance of the successive treatments, performing between the treatments a plurality of pre-dispenses for different purposes of the treatment solution, wherein at least a recipe of the treatment solution to be pre-dispensed or a start condition of the pre-dispense is determined for each of the pre-dispenses. According to the present invention, the pre-dispense can be performed at a necessary and sufficient frequency to shorten the suspension time due to the pre-dispenses in the substrate treatment. This improves the throughput and reduces the number of pre-dispenses, resulting in reduced consumption of the treatment solution.

15 Claims, 19 Drawing Sheets

FIG. 8

| | TIME CONDITION (sec) | DISCHARGE AMOUNT (cc) |
|---|---|---|
| D1 | 1000 | 100 |
| D2 | 500 | 100 |
| D3 | 500 | 10 |
| D4 | 1000 | 10 |

FIG. 9

| PRIORITY LEVEL | KIND OF PRE-DISPENSE |
|---|---|
| A | D3 |
| A | D4 |
| ① | D1 |
| ② | D2 |
| — | |

FIG. 13

| PRIORITY LEVEL | KIND OF PRE-DISPENSE |
|---|---|
| A | D4 |
| ① | D1、D3 |
| ② | D2 |
| — | ———— |

FIG. 18

| STEP | NUMBER OF ROTATIONS (rpm) |
|---|---|
| 1 | R1 : 2000 |
| 2 | R2 : 3500 |
| 3 | R3 : 2500 |

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus.

2. Description of the Related Art

In fabrication processes of semiconductor devices, a resist coating treatment is performed in which a resist solution is supplied to, for example, a semiconductor wafer (hereafter referred to as a "wafer") to form a resist film on the front face of the wafer.

This resist coating treatment is normally performed in a resist coating unit. The resist coating unit is provided with a nozzle for supplying a predetermined amount of the resist solution to the wafer. The nozzle is connected to a storage tank, which is a supply source of the resist solution, via a pipe. This pipe is provided with, for example, a pump for feeding the resist solution by pressure, a filter for removing impurities, an open/close valve for controlling discharge of the resist solution, and so on. These members constitute a supply mechanism of the resist solution. The resist solution in the storage tank is discharged from the nozzle via the pump, filter, open/close valve, and so on. In the resist coating unit, treatment is repeatedly performed in which the resist solution is supplied to wafers carried into the unit in succession.

By the way, in the resist coating unit, a pre-dispense of once draining the resist solution staying in the pipe via the nozzle has conventionally been performed before actual supply to a substrate. The pre-dispense in the prior art has been performed for the supply mechanism in the same system based on a single recipe and start condition. The reason why the pre-dispense has been performed based on the single recipe and start condition is to simplify control of the resist coating unit which normally has a supply mechanism in a plurality of systems.

However, there are a plurality of purposes of performance of the pre-dispense in the resist coating unit. The pre-dispense includes, for example, one performed at the time of change of lot for stabilizing the discharge amount of the resist solution from the nozzle, one for removing bubbles staying in the filter and pump, one for preventing drying of the nozzle and the like, and so on. The recipes including the discharge amounts of the respective pre-dispenses required for attaining these purposes and start conditions of the pre-dispenses are actually different from each other depending on their different purposes.

If it is desired to accomplish all the purposes of pre-dispenses by one kind of setting in the same supply mechanism as in the prior art, it is necessary to match, for example, regarding the frequency of pre-dispenses, the start condition to the setting of a pre-dispense which has a relaxed start condition, that is, which needs to be performed most frequently. The discharge amount also needs to be matched to the amount of a pre-dispense having the largest discharge amount among many pre-dispenses.

Besides, the resist solution coating treatment successively performed for wafers is performed in succession for every lot of substrates. When the supply of the resist solution to the wafer is stopped, the resist solution remains in the nozzle and the supply pipe. When left standing for a long time, the remaining resist solution dries or changes in quality. Therefore, a pre-dispense is performed at a break between treatments for lots of wafers as described above. Conventionally, the pre-dispense performed at a break between the lots has been performed uniformly every change of lot without fail.

During the pre-dispense, however, the treatment for wafers is suspended, and thus if its recipe is matched to that of the pre-dispense which needs to be performed most frequently, the throughput of the treatment is significantly decreased. Further, the resist solution discharged when the pre-dispense is normally disposed, resulting in increased amount of the resist solution going to waste. This problem also applies to the case in which the pre-dispense is performed every change of lot.

SUMMARY OF THE INVENTION

The present invention is made in the above viewpoints, and it is an object of the present invention to improve the throughput and to reduce the consumption of a treatment solution when performing pre-dispenses for respective purposes, by omitting unnecessary pre-dispenses.

According to a first aspect of the present invention, the present invention is a substrate treatment method in which a treatment by supplying a treatment solution from a nozzle to a substrate is successively performed for a plurality of substrates, comprising the step of, during the performance of the successive treatments, performing between the treatments a plurality of pre-dispenses for different purposes of the treatment solution, wherein at least a recipe of the treatment solution to be pre-dispensed or a start condition of the pre-dispense is determined for each of the pre-dispenses.

According to the present invention, the start condition and the like are determined for each of the plurality of pre-dispenses, so that the pre-dispense can be performed in accordance with a purpose. For example, the pre-dispense can be performed at a necessary and sufficient frequency for attaining each purpose to shorten the suspension time due to the pre-dispenses in the substrate treatment, resulting in improved throughput. Further, it is possible to omit unnecessary pre-dispenses to thereby reduce the consumption of the treatment solution by the pre-dispenses.

According to a second aspect of the present invention, the present invention is a substrate treatment method in which a treatment by supplying a treatment solution to a substrate is successively performed for a plurality of substrates, comprising the step of performing a pre-dispense of the treatment solution at a break between lots of the substrates, wherein the step of performing the pre-dispense is performed only when the kind of the supplied treatment solution is changed between the lots.

According to the present invention, the pre-dispense is performed only when the kind of the treatment solution is changed between the lots and not every change of lot as in the prior art, resulting in reduced number of pre-dispenses. Therefore, the total consumption of the treatment solution is reduced for reduced cost. Further, when no pre-dispense is performed, the treatment is not suspended, so that the treatment for the subsequent substrate can be started immediately, resulting in improved efficiency of treating substrates.

BRIEF DESCRIPTION OF THE DRAWINGS

FIG. 8 is an explanatory view showing an example of a setting screen;

FIG. 9 is an explanatory view showing an example of giving priority levels to pre-dispenses;

FIG. 13 is an explanatory view showing another example of giving priority levels to the pre-dispenses;

FIG. 18 is a table showing the number of rotations of a wafer in each step of a resist coating treatment.

DETAILED DESCRIPTION OF THE INVENTION

Figure 1:
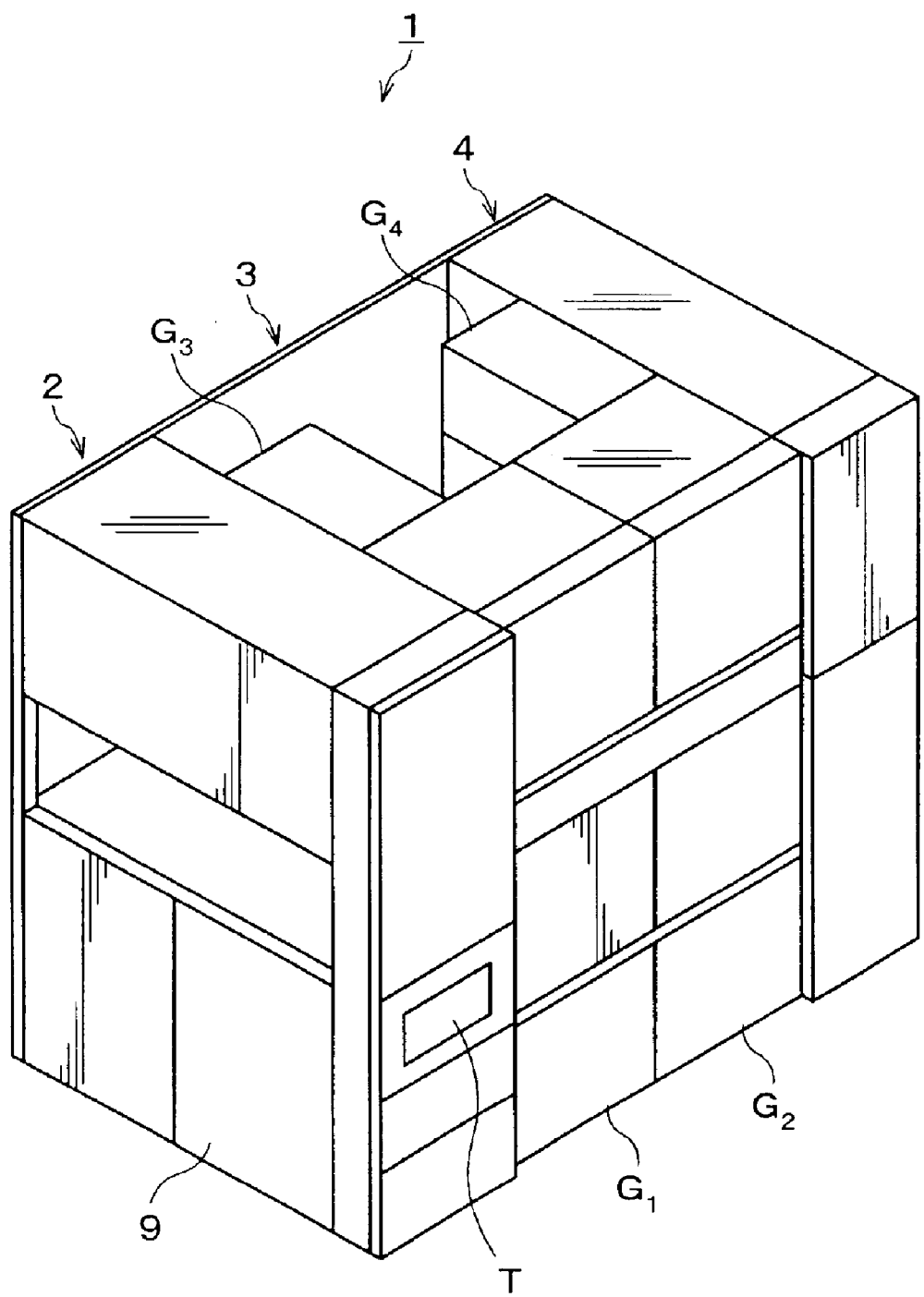
FIG. 1 is a perspective view of a coating and developing treatment system to which an embodiment of the present invention is applied.

Hereinafter, preferred embodiments of the present invention will be described. FIG. 1 is a perspective view of a coating and developing treatment system 1 capable of implementing a substrate treatment method according to the this embodiment, and FIG. 2 is a plane view schematically showing the configuration of the coating and developing treatment system 1.

Figure 2:
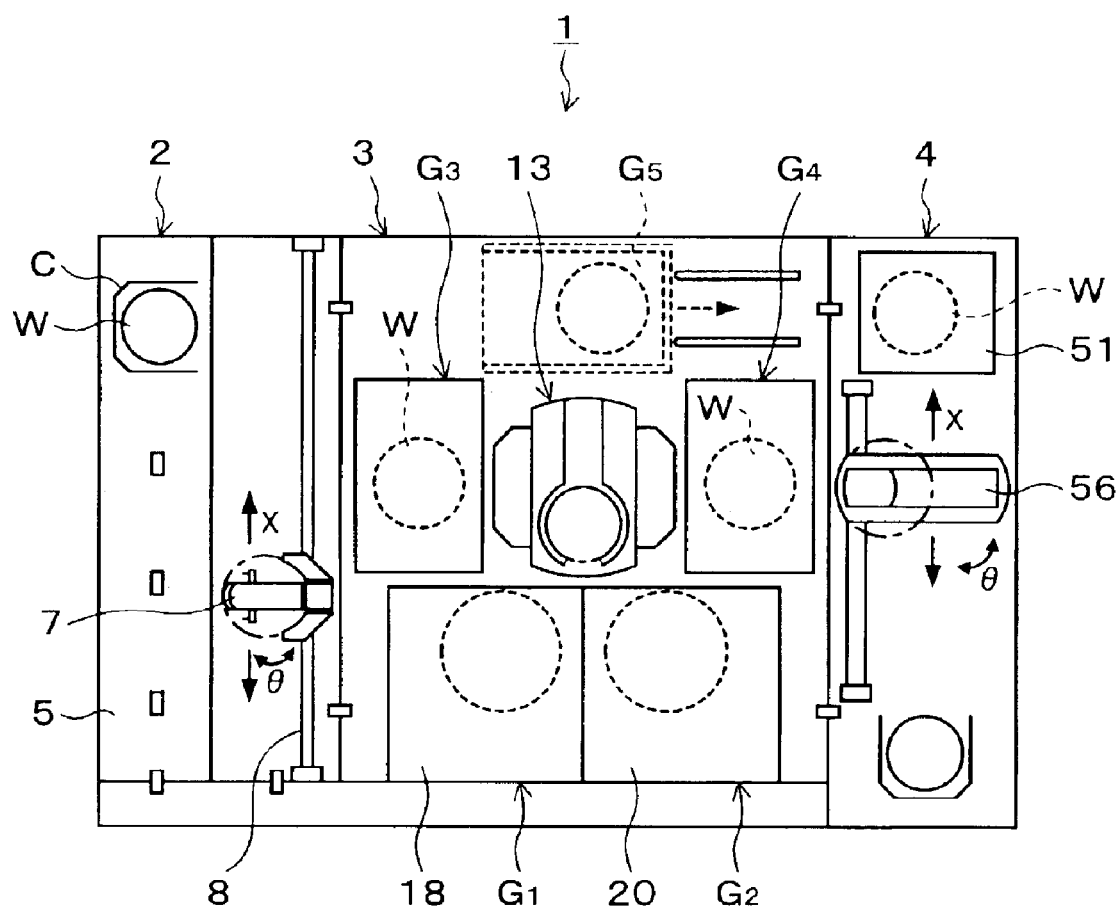
FIG. 2 is a plane view schematically showing the configuration of the coating and developing treatment system in FIG. 1.

As shown in FIG. 1 and FIG. 2, the coating and developing treatment system 1 has a configuration in which a cassette station 2 for carrying, for example, 25 wafers W in a unit of cassette from/to the outside to/from the coating and developing treatment system 1 and for carrying the wafers W to/from a cassette C, a processing station 3 composed of various kinds of processing units which are disposed in multi-tiers, for performing predetermined processing for the wafers W one by one in coating and developing processes, and an interface section 4 for delivering/receiving the wafers W to/from an aligner (not-shown) which is provided adjacent to the processing station 3 are integrally connected.

In the cassette station 2, as shown in FIG. 2, a plurality of the cassettes C are mountable, as shown in FIG. 2, in predetermined positions on a cassette mounting table 5, which serves as a mounting portion, in a line in an X-direction (a vertical direction in FIG. 2). Furthermore, a wafer carrier 7, which is transportable in the alignment direction of the cassettes (the X-direction) and in an alignment direction of the wafers W housed in the cassette C (a Z-direction; a vertical direction), is provided to be movable along a carrier path 8 so that it can selectively access to each of the cassettes C.

The wafer carrier 7 has an alignment function for aligning the wafers W. The wafer carrier 7 can access to an extension unit 32 included in a third processing unit group G3 on the processing station 3 side as will be described below. In the cassette station 2, as shown in FIG. 1, a control section 9 is provided which conducts setting and control for the various kinds of processing units.

In the processing station 3, a main carrier 13 is provided in a center part thereof, and various kinds of the processing units are multi-tiered on a periphery of the main carrier 13 to constitute processing unit groups. In the coating and developing treatment system 1, where four processing unit groups G1, G2, G3 and G4 are arranged, the first and second processing unit groups G1 and G2 are disposed on a front side of the coating and developing treatment system 1, the third processing unit group G3 is disposed adjacent to the cassette station 2, and the fourth processing unit group G4 is disposed adjacent to the interface section 4. Furthermore, a fifth processing unit group G5 depicted by a broken line is allowed to be additionally disposed on a rear side as an option. The main carrier 13 is capable of carrying the wafers W to/from the various kinds of later described processing units which are disposed in these processing unit groups G1, G2, G3, G4 and G5. Incidentally, the number and the arrangement of the processing unit groups are different depending on the kind of processing performed on the wafers W, and the number of the processing unit groups is arbitrarily selected.

Figure 3:
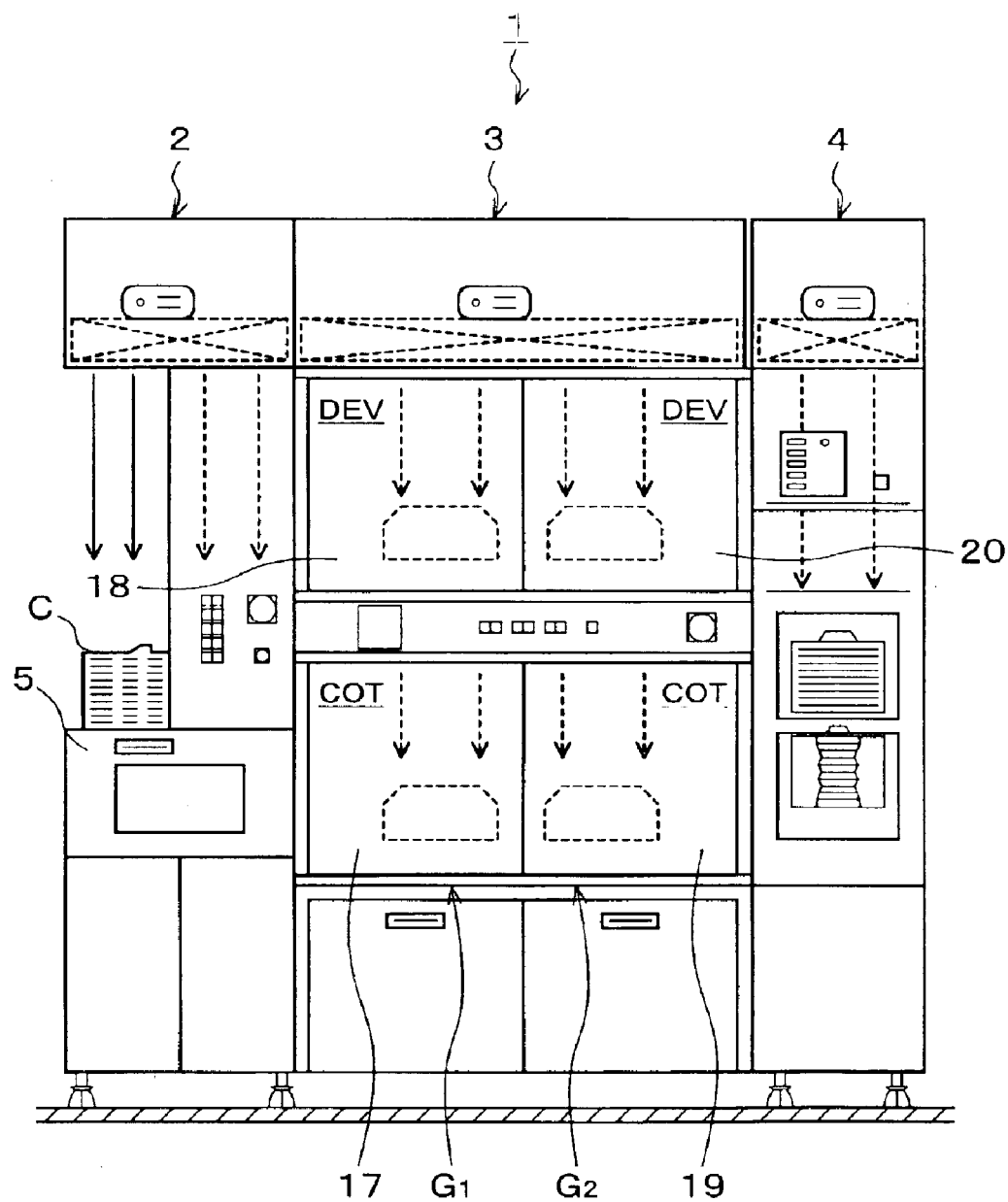
FIG. 3 is a front view of the coating and developing treatment system in FIG. 1.

In the first processing unit group G1, for example, as shown in FIG. 3, a resist coating unit 17, in which the substrate treatment method according to this embodiment is implemented, and a developing unit 18 for developing the wafer W after exposure are two-tiered in the order from the bottom. Similarly, in the processing unit group G2, a resist coating unit 19 and a developing unit 20 are two-tiered in the order from the bottom.

Figure 4:
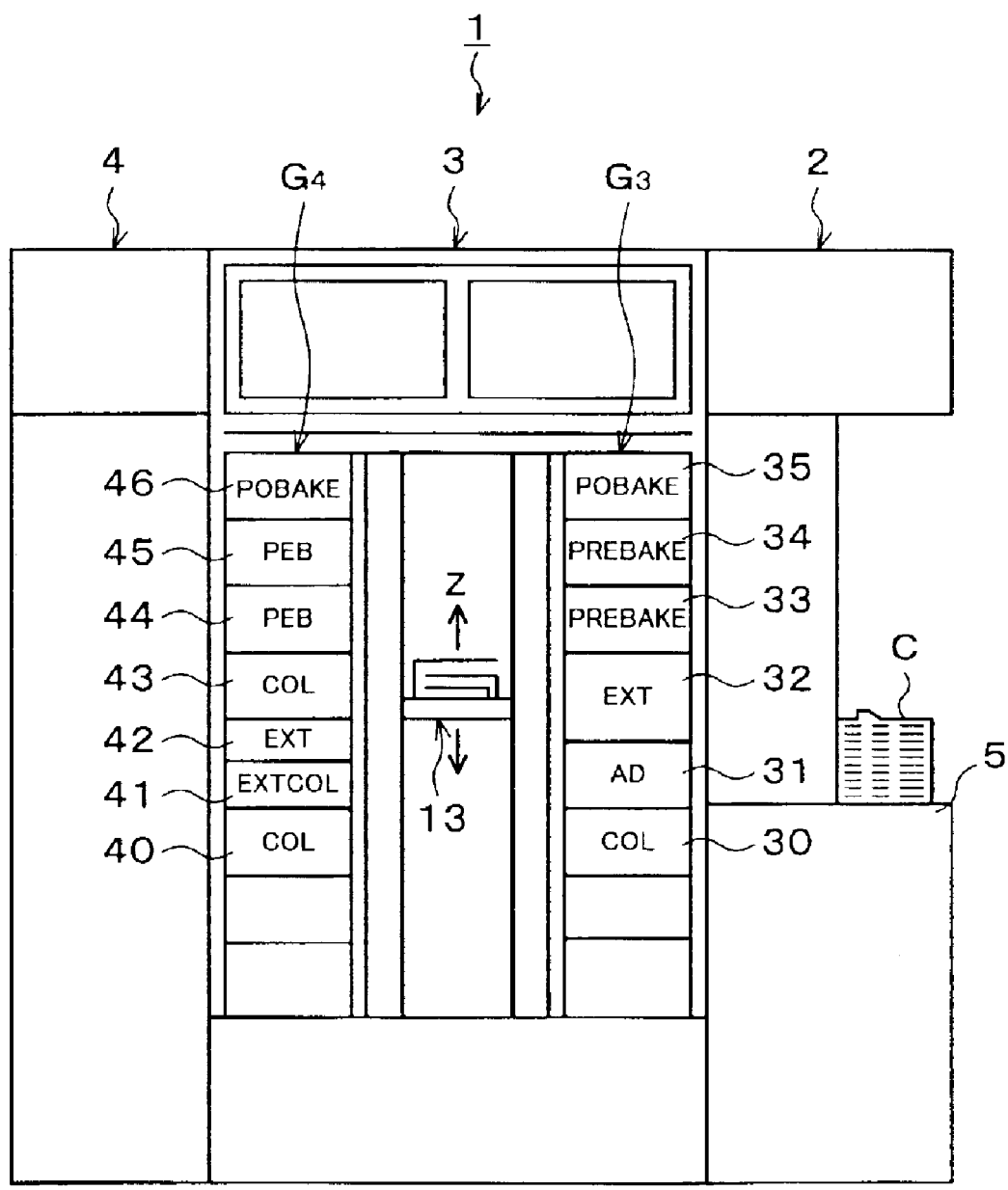
FIG. 4 is a rear view of the coating and developing treatment system in FIG. 1.

In the third processing unit group G3, for example, as shown in FIG. 4, a cooling unit 30 for cooling the wafer W, an adhesion unit 31 for enhancing adhesion between a resist solution and the wafer W, the extension unit 32 for delivering/receiving the wafers W, pre-baking units 33 and 34 for drying a solvent in the resist solution, and a post-baking unit 35 for performing a heat treatment after a developing treatment are, for example, six-tiered in the order from the bottom.

In the fourth processing unit group G4, for example, a cooling unit 40, an extension and cooling unit 41 for allowing the wafer W mounted thereon to naturally cool, an extension unit 42, a cooling unit 43, post-exposure baking units 44 and 45 for performing a heat treatment after exposure, and a post-baking unit 46 are, for example, seven-tiered in the order from the bottom.

In a center part of the interface section 4, as shown in FIG. 2, for example, a wafer carrier 56 is provided. The wafer carrier 56 is configured to be freely movable in the X-direction (the vertical direction in FIG. 2 and the Z-direction (the perpendicular direction), and to be freely rotatable in a θ-direction (a direction of rotation about the Z-axis). Therefore, the wafer carrier 56 can access to the extension and cooling unit 41 and the extension unit 42 which are included in the fourth processing unit group G4, an edge exposure unit 51, and the not-shown aligner to carry the wafer W to each of them.

Figure 5:
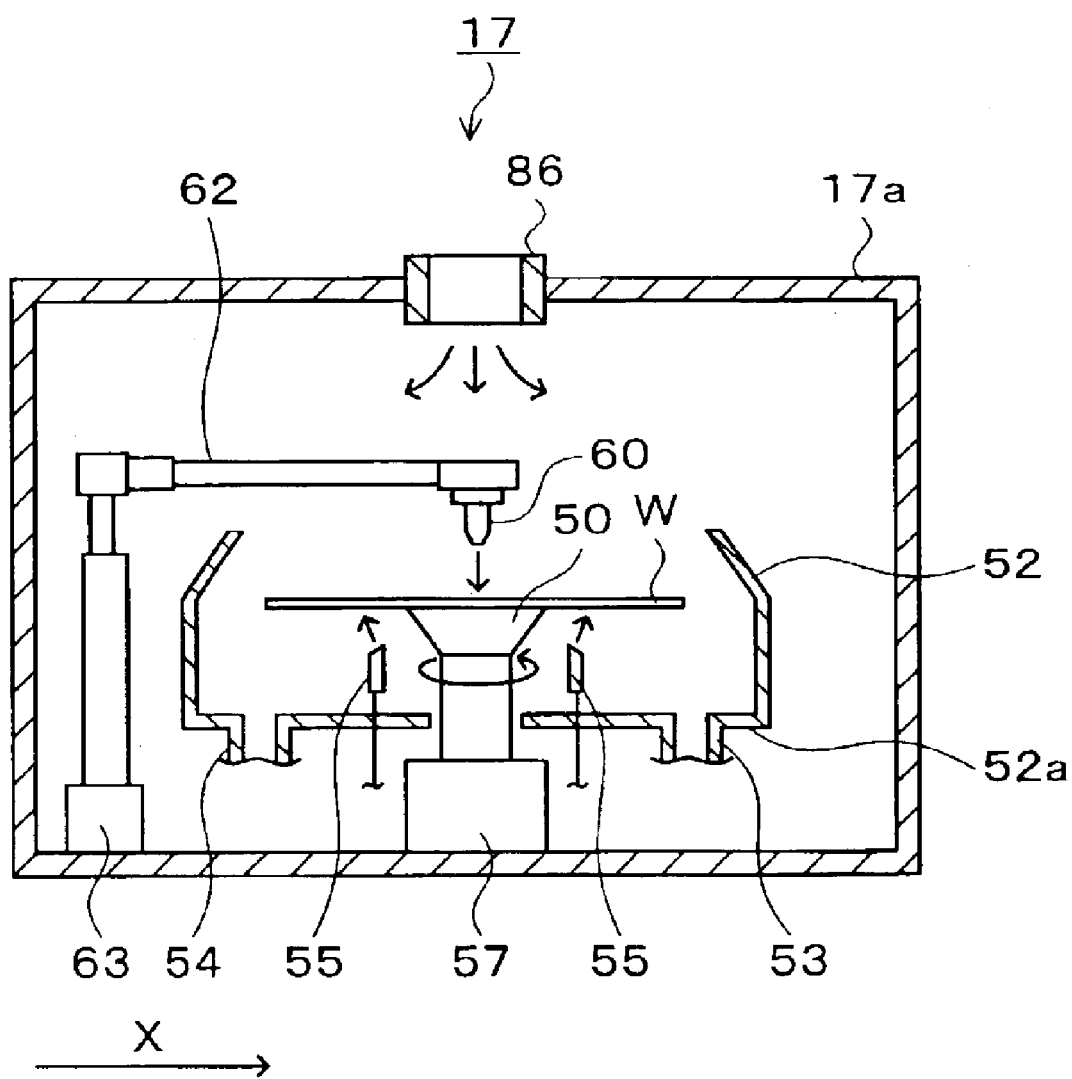
FIG. 5 is an explanatory view of a vertical cross section schematically showing the configuration of a resist coating unit.
Figure 6:
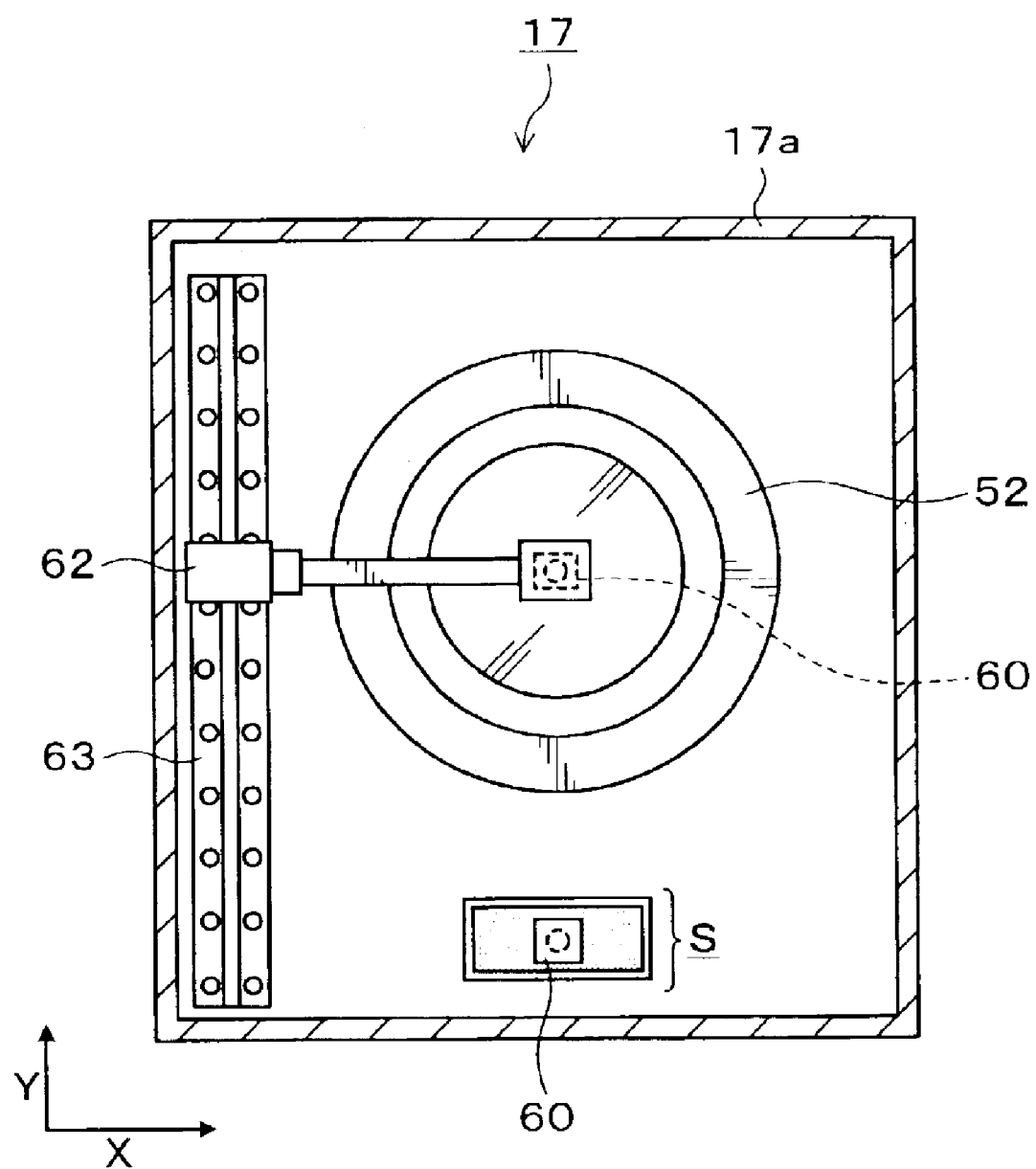
FIG. 6 is an explanatory view of a horizontal cross section schematically showing the configuration of the resist coating unit.

Next, the configuration of the aforementioned resist coating unit 17 will be described. FIG. 5 is an explanatory view of a vertical cross section schematically showing the configuration of the resist coating unit 17, and FIG. 6 is an explanatory view of a horizontal cross section of the resist coating unit 17.

The resist coating unit 17 has, for example, as shown in FIG. 5, a casing 17a, and at a center part thereof a spin chuck 50 is provided for holding and rotating the wafer W. This spin chuck 50, which is driven by a driver 57 provided with a motor, a cylinder, and the like, can rotate, for example, at a predetermined speed and rise and lower.

The outside of the spin chuck 50 is surrounded by an almost cylindrical cup 52 with an open upper face. This cup 52 can receive and collect the resist solution and the like splashing from the wafer W. A bottom face 52a of the cup 52 is provided with a drain pipe 53 for draining the collected resist solution and the like, and an exhaust pipe 54 for exhausting an atmosphere in the cup 52.

Inside the cup 52 and below the wafer W held on the spin chuck 50, cleaning solution supply nozzles 55 are provided. The cleaning solution supply nozzles 55 can supply a cleaning solution such as a thinner or the like to the rear face of the wafer W to clean the rear face of the wafer W.

The resist coating unit 17 is provided with a nozzle 60 for supplying the resist solution to the wafer W. The nozzle 60 is supported by a nozzle arm 62. The nozzle arm 62 can move, for example, on a rail 63 extending in the Y-direction provided on the negative side in the X-direction (on the left side in FIG. 6) with respect to the cup 52, for example, as shown in FIG. 6. The nozzle arm 62 is moved, for example, by a not-shown driver. On the negative side in the Y-direction with respect to the cup 52, for example, a waiting section S of the nozzle 60 is provided, and the nozzle arm 62 can move to a position above the waiting section S. Therefore, the nozzle arm 62 can move the nozzle 60 at the waiting section S to a position above the center portion of the wafer W in the cup 52.

Figure 7:
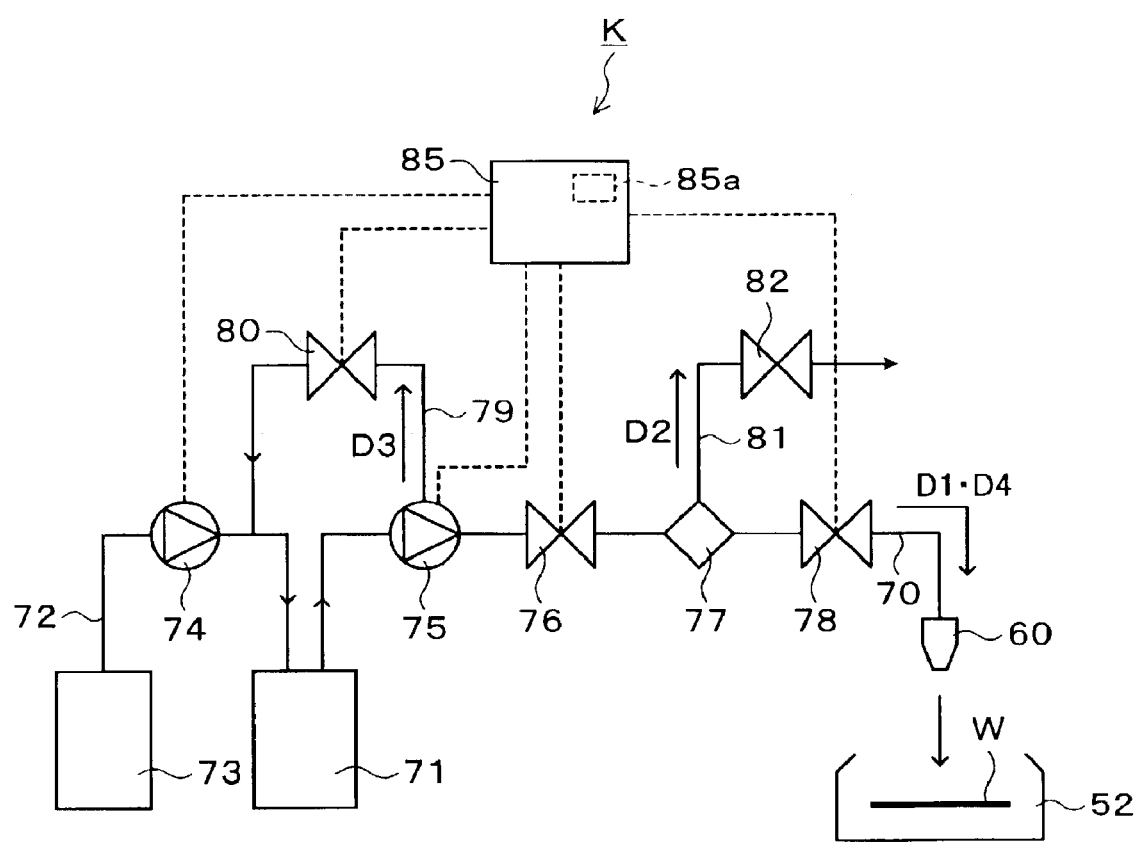
FIG. 7 is an explanatory view showing the configuration of a resist solution supply mechanism.

The following description will be made on one example of a resist solution supply mechanism K for supplying the resist solution to the nozzle 60 with reference to FIG. 7.

The nozzle 60 is communicated and connected with a storage tank 71, for example, via a first pipe 70. The storage tank 71 is communicated and connected with a solution bottle 73, which is a supply source of the resist solution, via a second pipe 72. The second pipe 72 is provided with a pump 74 which can replenish the storage tank 71 with the resist solution in the solution bottle 73. The first pipe 70 is provided with a discharge pump 75, a first valve 76, a filter 77, and a second valve 78 in this order, for example, from the storage tank 71 side.

The discharge pump 75 sucks a predetermined amount of the resist solution in the storage tank 71 and feeds it by pressure to the nozzle 60, and, for example, a diaphragm type pump is used as the discharge pump 75. The discharge pump 75 is provided with a purge pipe 79 communicated with the second pipe 72, for exhausting bubbles collecting in the discharge pump 75. The purge pipe 79 is provided with an open/close valve 80. Opening the open/close valve 80 with the discharge pump 75 being operated allows bubbles collecting in the discharge pump 75 to be exhausted with the resist solution into the storage tank 71. In other words, a pre-dispense D1 can be performed for the purpose of exhausting the bubble in the discharge pump 75.

The filter 77 is for removing impurities contained in the resist solution. This filter 77 is connected with a vent pipe 81 which exhausts the bubbles collecting, for example, in the filter 77 to the outside of the resist coating unit 17. The vent pipe 81 is provided with an open/close valve 82. Opening the open/close valve 82 with the discharge pump 75 being operated allows bubbles in the filter 77 to be exhausted. In other words, a pre-dispense D2 can be performed for the purpose of exhausting the bubble in the filter 77.

The second valve 78 opens and closes to start and stop the discharge of the resist solution by the discharge pump 60. Opening the second valve 78 and operating the discharge pump 75 allow the resist solution in the storage tank 71 to be discharged from the nozzle 60. In other words, the second valve 78 can perform a pre-dispense D3 for the purpose of preventing the nozzle 60 from drying and a pre-dispense D4 for the purpose of stabilizing the discharge solution as well as the supply of the resist solution to the wafer W.

Actions of parts of the discharge pump 75 and so on in the resist solution supply mechanism K, are controlled by a main controller 85 provided, for example, in the control section 9. Therefore, the pre-dispenses of the resist solution performed in the resist solution supply mechanism K can be controlled by the main controller 85. In the main controller 85, a recipe, for example, the discharge amount and start condition of dispense can be set for each of the above-described pre-dispenses D1 to D4 having the different purposes.

In the main controller 85, a set time is provided for each of the pre-dispenses D1 to D4. The main controller 85 has a not-shown measuring unit 85a. When the integrated time measured by this measuring unit 85a exceeds the aforementioned set time, each of the pre-dispenses D1 to D4 is performed.

In other words, the start condition in this embodiment is time condition that the integrated time of each of the pre-dispenses D1 to D4 exceeds each of the set times. The integrated time is counted from the preceding performance of the same kind of pre-dispense or from the preceding reset of the integrated time. As for the set times of the pre-dispenses D1 to D4, for example, the pre-dispense D1 is set to 1000 sec, the pre-dispense D2 to 500 sec, the pre-dispense D3 to 500 sec, and the pre-dispense D4 to 1000 sec.

On the other hand, each of the discharge amounts of the pre-dispenses D1 to D4 is set to, for example, a minimal amount for attaining the purpose of each of the pre-dispenses D1 to D4. For example, the pre-dispense D1 is set to 100 cc, the pre-dispense D2 to 100 cc, the pre-dispense D3 to 10 cc, and the pre-dispense D4 to 10 cc. These time conditions and discharge amounts can be set, for example, on a setting screen T that is an input means of the control section 9 shown in FIG. 1. On the setting screen T, the time conditions and the discharge amounts of the pre-dispenses D1 to D4 can be set by a touch panel system, for example, as shown in FIG. 8.

In the main controller 85, priority levels can be set for the pre-dispenses D1 to D4. When a pre-dispense at a high priority level is performed, the counts of the integrated times of pre-dispenses at priority levels lower than that are reset.

On the other hand, when a pre-dispense at a low priority level is performed, the counts of the integrated times for pre-dispenses at priority levels higher than that are continued.

It is also possible to set in the main controller 85 the pre-dispenses D1 to D4 as pre-dispenses with no priority level, that is, pre-dispenses at independent priority levels (independent of the other pre-dispenses with given priority levels). In other words, the pre-dispenses at the independent priority levels are performed based on independent start conditions irrespective of performance or non-performance of pre-dispenses with given priority levels.

In this embodiment, for example, the pre-dispense D1 is set to a priority level ①, and the pre-dispense D2 is set to a priority level ② lower than the priority level ① as shown in FIG. 9. The pre-dispenses D3 and D4 are set to independent priority levels A. It should be noted that in this embodiment, when the pre-dispense D1 is performed, the pre-dispense D2 in that cycle is not performed. Therefore, the discharge amount of the pre-dispense D1 is matched to the discharge amount of the pre-dispense D2 to attain sufficiently the purpose of the pre-dispense D2.

To an upper face of the casing 17a, a duct 86 is connected which supplies the inside of the cup 52 with nitrogen gas, inert gas, air, or the like which is controlled in temperature and humidity and cleaned as shown in FIG. 5. This allows the gas to be supplied to maintain a predetermined atmosphere in the cup 52, for example, during the coating treatment of the wafer W and during the pre-dispense of the resist solution.

Next, the method for treating the wafer W performed in the resist coating unit 17 configured as above will be described together with a series of photolithography processes performed in the coating and developing treatment system 1.

First, one unprocessed wafer W is taken out of the cassette C by the wafer carrier 7 and carried to the extension unit 32 included in the third processing unit group G3. Then, the wafer W is carried by the main carrier 13 into the adhesion unit 31 where the wafer W is coated with, for example, HMDS for enhancing adhesion to the resist solution. Subsequently, the wafer W is carried to the cooling unit 30 and cooled to a predetermined temperature. The wafer W cooled to the predetermined temperature is carried by the main carrier 13, for example, to the resist coating unit 17.

The wafer W for which a resist coating treatment as substrate treatment has been finished in the resist coating unit 17 is carried by the main carrier 13 to the pre-baking unit 33, the extension and cooling unit 41 in sequence, and further carried by the wafer carrier 56 to the edge exposure unit 51 and the aligner (not-shown) in sequence so that the wafer W is subjected to predetermined processing in each unit. Then, the wafer W for which exposure has been finished is returned to the extension unit 42 by the wafer carrier 56, and thereafter carried by the man carrier 13 to the post-exposure baking unit 44, the cooling unit 43, the developing unit 18, the post-baking unit 46, and the cooling unit 30 in sequence so that the wafer W is subjected to predetermined processing in each unit. Thereafter, the wafer W is returned to the cassette C via the extension unit 32, and a series of photolithography processes comes to an end.

In the aforementioned resist coating treatment, when the wafer W is first carried by the main carrier 13 into the casing 17a and suction-held by the spin chuck 50, the spin chuck 50 lowers so that the wafer W is housed in the cup 52. Subsequently, the nozzle 60 waiting at the waiting section S is moved by the nozzle arm 62 to the position above the center portion of the wafer W.

Thereafter, the main controller 85 issues an instruction to operate the discharge pump 75 and to open the first valve 76 and the second valve 78. This causes a predetermined amount of the resist solution to be discharged onto the center part of the wafer W. Subsequently, the wafer W is rotated at a predetermined rotation speed, so that the resist solution on the wafer W is spread over the entire front face of the wafer. W. Thereafter, the rotation speed of the wafer W is increased to adjust the film thickness of the solution film of the resist solution on the wafer W.

After the adjustment of the film thickness, the rotation speed of the wafer W is decreased, and the rear face of the wafer W is cleaned by the cleaning solution supply nozzles 55. Thereafter, the wafer W is kept rotated to be dried by spinning off the cleaning solution.

After the completion of the dry processing of the wafer W, the rotation of the wafer W is stopped, and the wafer W is delivered from the spin chuck 50 to the main carrier 13 to be carried out of the casing 17a. In the resist coating unit 17, the resist coating treatment is repeated for the wafers which are loaded in the unit in succession.

Figure 10:
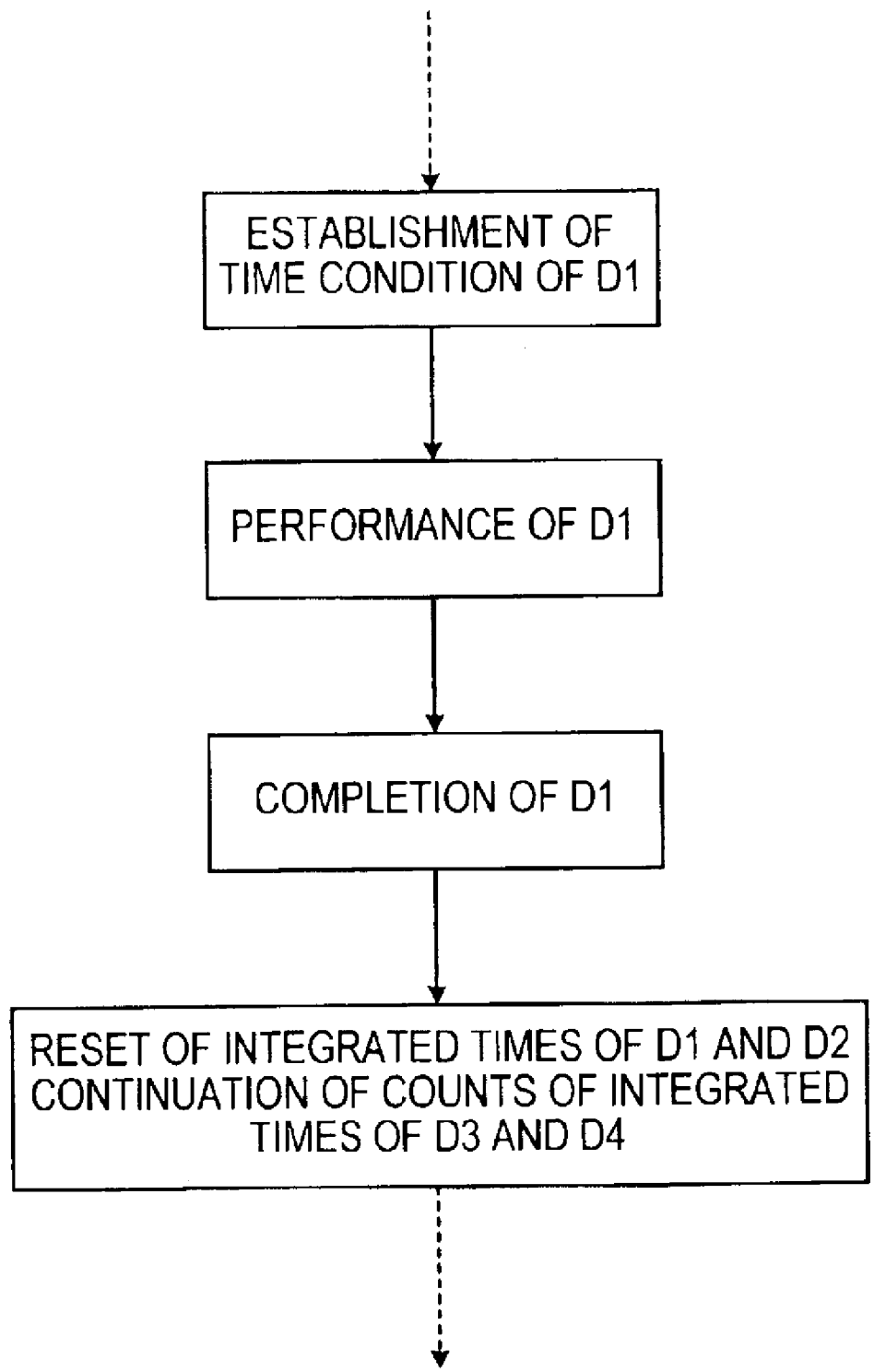
FIG. 10 is an explanatory view showing an example of a flow of performing the pre-dispense.

For example, during the repeated above-described resist coating treatments, when any one of the time conditions of the pre-dispenses D1 to D4 is established, the pre-dispense in the resist solution supply mechanism K is performed. When the time condition of the pre-dispense D1 at the priority level ① is established, for example, as shown in FIG. 10, the pre-dispense D1 is performed. In this pre-dispense D1, for example, the open/close valves 80 and 82 and the first valve 76 are opened, and the discharge pump 75 is operated. This permits the discharge pump 75 to feed the set discharge amount of the resist solution by pressure to the vent pipe 81 so as to exhaust via the vent pipe 81 the bubbles in the filter 77 together with the resist solution. In this event, opening the open/close valve 80 permits also the bubbles in the discharge pump 75 to be exhausted via the purge pipe 79. In short, the purpose of the pre-dispense D2 is also attained.

After the completion of the pre-dispense D1, the count of the integrated time of the pre-dispense D1 is reset. In this event, the count of the integrated time of the pre-dispense D2 at the priority level lower than the first pre-dispense D1 is also reset. Note that the counts of the integrated times of the pre-dispenses D3 and D4 are continued.

Figure 11:
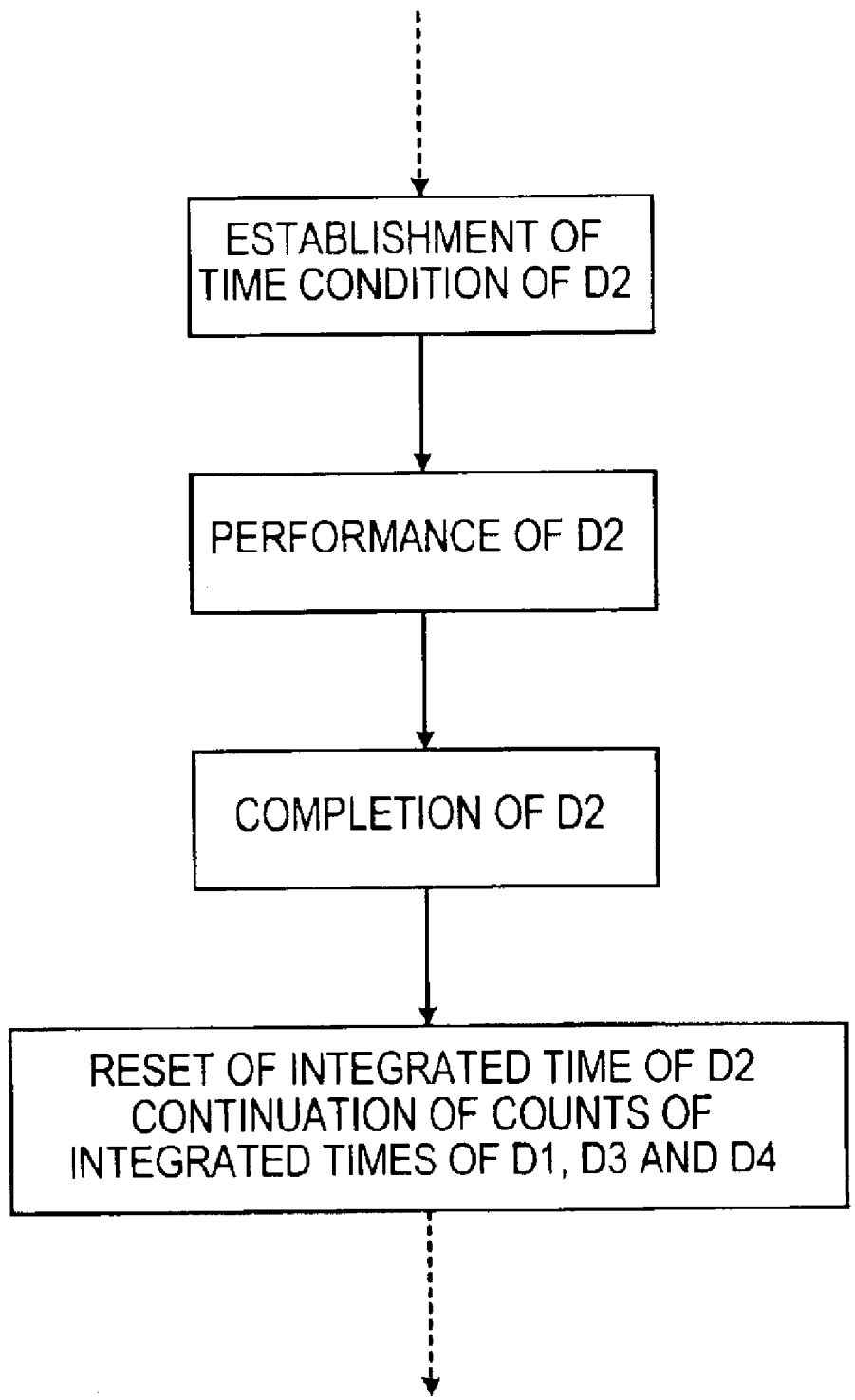
FIG. 11 is an explanatory view showing an example of a flow of performing the pre-dispense.

When the condition of the pre-dispense D2 at the priority level ② is established, the pre-dispense D2 is performed as shown in FIG. 11. This pre-dispense D2 is performed by operating the discharge pump 75 with the open/close valve 80 opened. This pre-dispense D2 is performed with the first valve 76 closed and with no pressure impressed on the filter 77 side, so that only the purpose of the pre-dispense D2 is attained. After the completion of the pre-dispense D2, the count of the integrated time of the pre-dispense D2 is reset, and the counts of the integrated times of the other pre-dispenses D1, D3, and D4 are continued.

Figure 12:
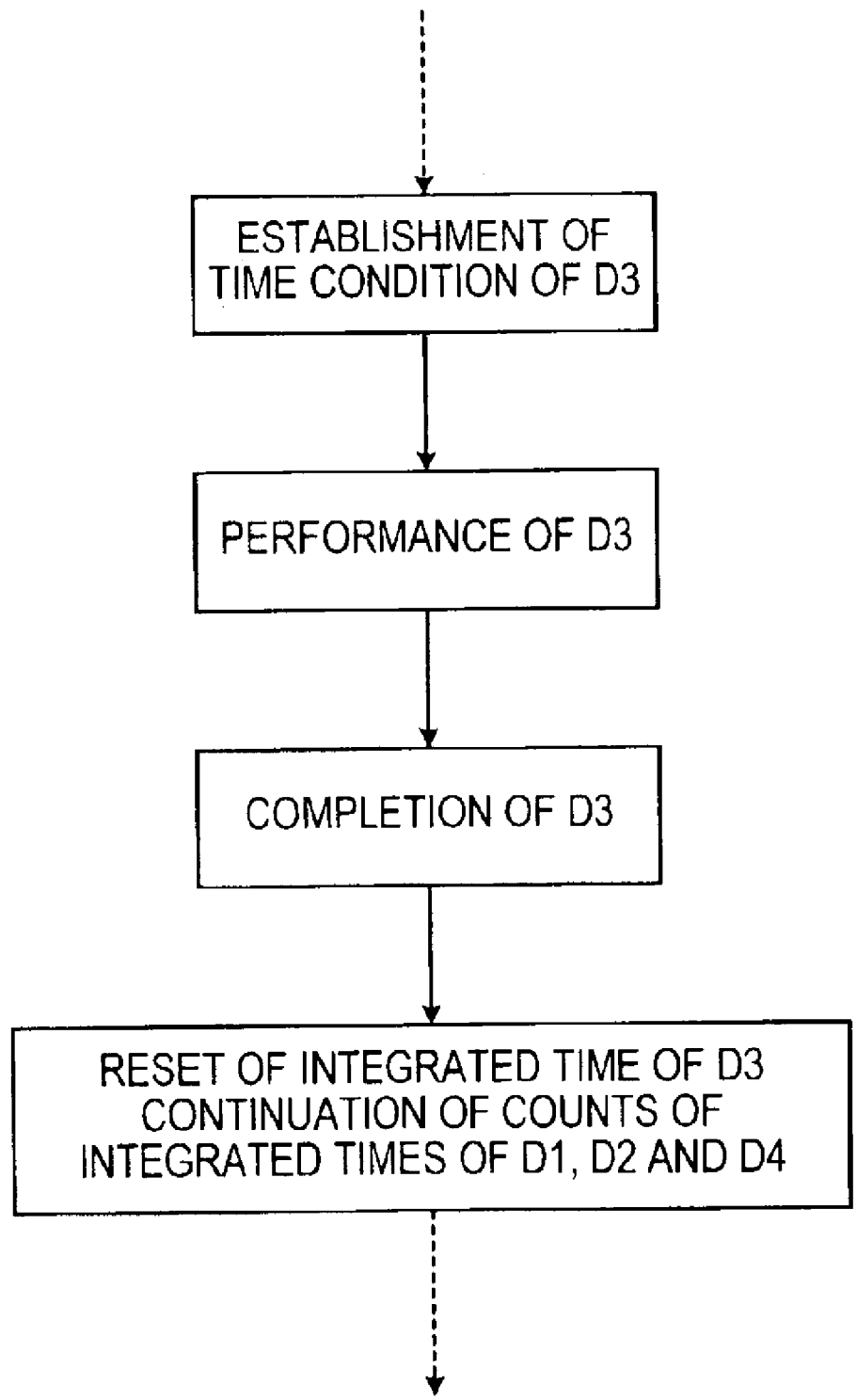
FIG. 12 is an explanatory view showing an example of a flow of performing the pre-dispense.

Further, the time condition of the pre-dispense D3 at the independent priority level A is established as shown in FIG. 12, the pre-dispense D3 is performed. For example, the pre-dispense D3 is performed with the discharge pump 75 operated, the first valve 76 and the second valve 78 opened, and the open/close valves 80 and 82 closed. After the completion of the pre-dispense D3, the count of only the integrated time of the performed pre-dispense D3 is reset. The counts of the integrated times of the other pre-dispenses at the priority level ① and the priority level ② and the pre-dispense D4 at the independent priority level A are continued. Note that when the time condition of the pre-dispense D4 at the independent priority level A is established, the same action as that in the pre-dispense D3 is performed.

According to the above embodiment, since the recipe and time condition can be set for each of the dispenses D1 to D4 for different purposes, a necessary and sufficient pre-dispense can be performed to fill each purpose. This results in prevention of an unintentional discharge amount and discharge of the resist solution at an unnecessary timing, thereby reducing the consumption of the resist solution. Further, the performance of the pre-dispense never stops the coating process for the wafer W, resulting in improved throughput of the wafer processing.

In this embodiment, the pre-dispenses D1 to D4 are given priority levels so that when a pre-dispense at a high priority level is performed, the count of the integrated time of a pre-dispenses at a lower priority level is reset. This permits, for example, the pre-dispense D1, which can also attain the purpose of the pre-dispense D2, to be set to a high priority level, thereby reducing the number of unnecessary pre-dispenses D2. Therefore, it is possible to omit unnecessary pre-dispenses and reduce the consumption of the resist solution.

The pre-dispenses D3 and D4 at the independent priority levels A which are performed independently of priority levels but based only on the own time conditions, thereby enabling reliable performance of an important pre-dispense whose purpose cannot be attained by the other pre-dispense.

Note that the kinds and purposes of the pre-dispenses described in the above embodiment can be arbitrarily changed in accordance with the configuration of the resist solution supply mechanism and so on. In this case, it is also adoptable to give priority levels to all pre-dispenses with no pre-dispense placed at the independent priority level, or conversely, to give the independent priority levels to all the pre-dispenses.

While one kind of pre-dispense is set to each priority level in this above embodiment, a plurality of pre-dispenses may be set to the same priority level. In this case, for example, the pre-dispenses D1 and D3 are placed at the priority level ① as shown in FIG. 13. After the pre-dispense D1 is performed and completed, the count of the integrated time of the pre-dispense D3 is not reset but continued. On the other hand, when the pre-dispense D3 is performed, the count of the integrated time of the pre-dispense D1 is not reset but continued. This ensures independence of the time conditions at the same priority level ① with the above-described priority maintained with respect to the priority level ②.

While the start conditions of the pre-dispenses D1 to D4 described in the above embodiment are time conditions, other start conditions may be adopted. For example, it is also adopted that the integrated number of treated wafers from the time of a preceding pre-dispense or the time of a preceding reset is measured for every pre-dispense, so that each of the pre-dispenses D1 to D4 is performed when the integrated number of treated wafers exceeds a set number of treated wafers. In this case, for example, the measuring unit 85a of the main controller 85 is provided with a function of measuring the number of treated wafers. Set numbers of treated wafers for the pre-dispenses D1 to D4 are set in the main controller 85. Further, the pre-dispenses D1 to D4 are given the above-described priority levels so that when a pre-dispense at a high priority level is performed, the integrated number of treated wafers of the pre-dispense at a lower priority level is reset. Besides, when a pre-dispense at a low priority level is performed, the integrated number of treated wafers of the pre-dispense at a higher priority level is continued. Also in this case, it is possible to omit unnecessary pre-dispenses and reduce the number of pre-dispenses.

Further, the start condition of the pre-dispense may be satisfaction of either condition that the above-described integrated time has elapsed the set time or that the above-described integrated number of treated wafers exceeds the set number of treated wafers. In this case, similarly to the above-described embodiment, when a pre-dispense at a high priority level is performed, the integrated time and the integrated number of treated wafers of a pre-dispense at a lower priority level are reset. Besides, when a pre-dispense at a low priority level is performed, the integrated time and the integrated number of treated wafers of a pre-dispense at a higher priority level are continued.

Figure 14:
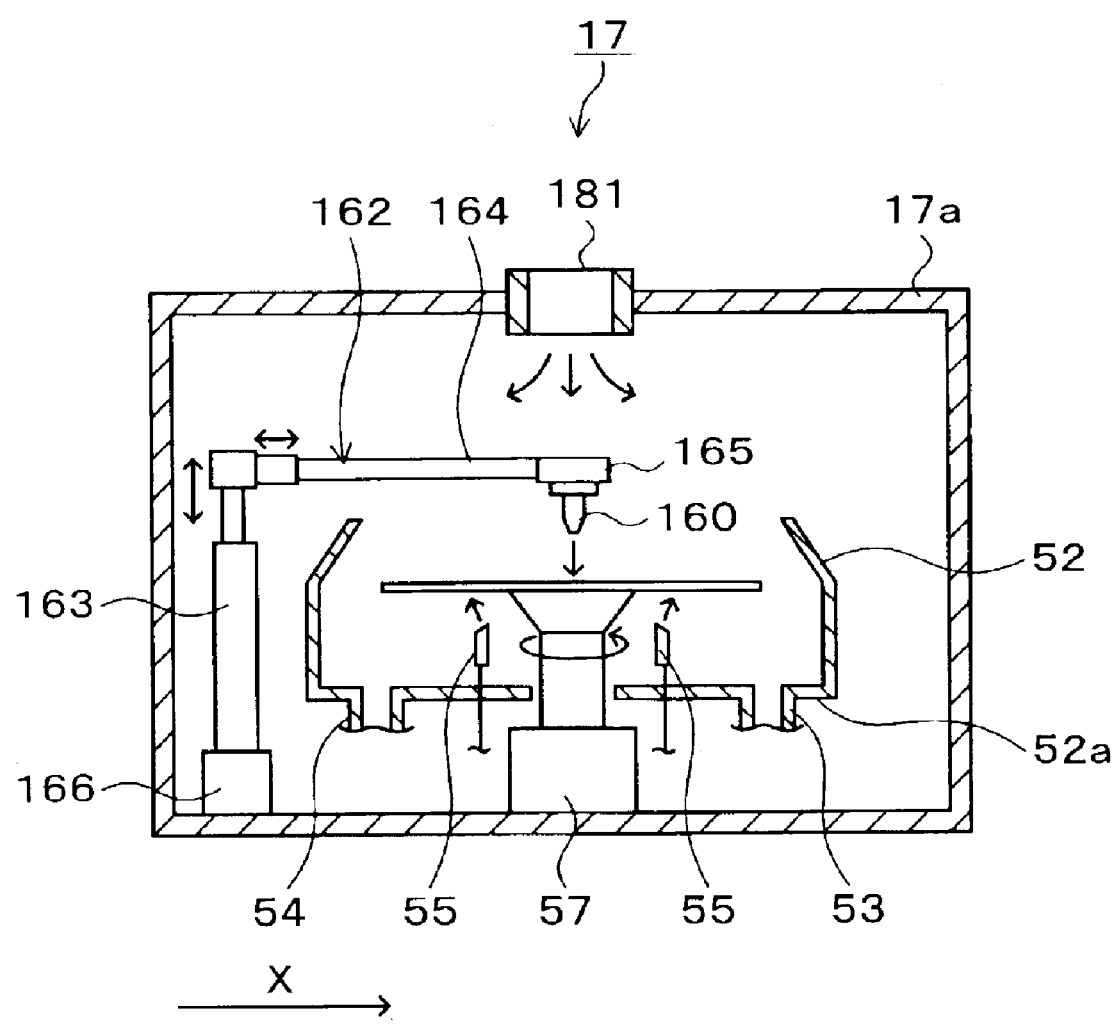
FIG. 14 is an explanatory view of a vertical cross section schematically showing the configuration of another example of the resist coating unit.

Next, another embodiment will be described. FIG. 14 is an explanatory view of a vertical cross section schematically showing the configuration of the resist coating unit 17 having another configuration, and FIG. 15 is an explanatory view of a horizontal cross section of the resist coating unit 17.

Figure 15:
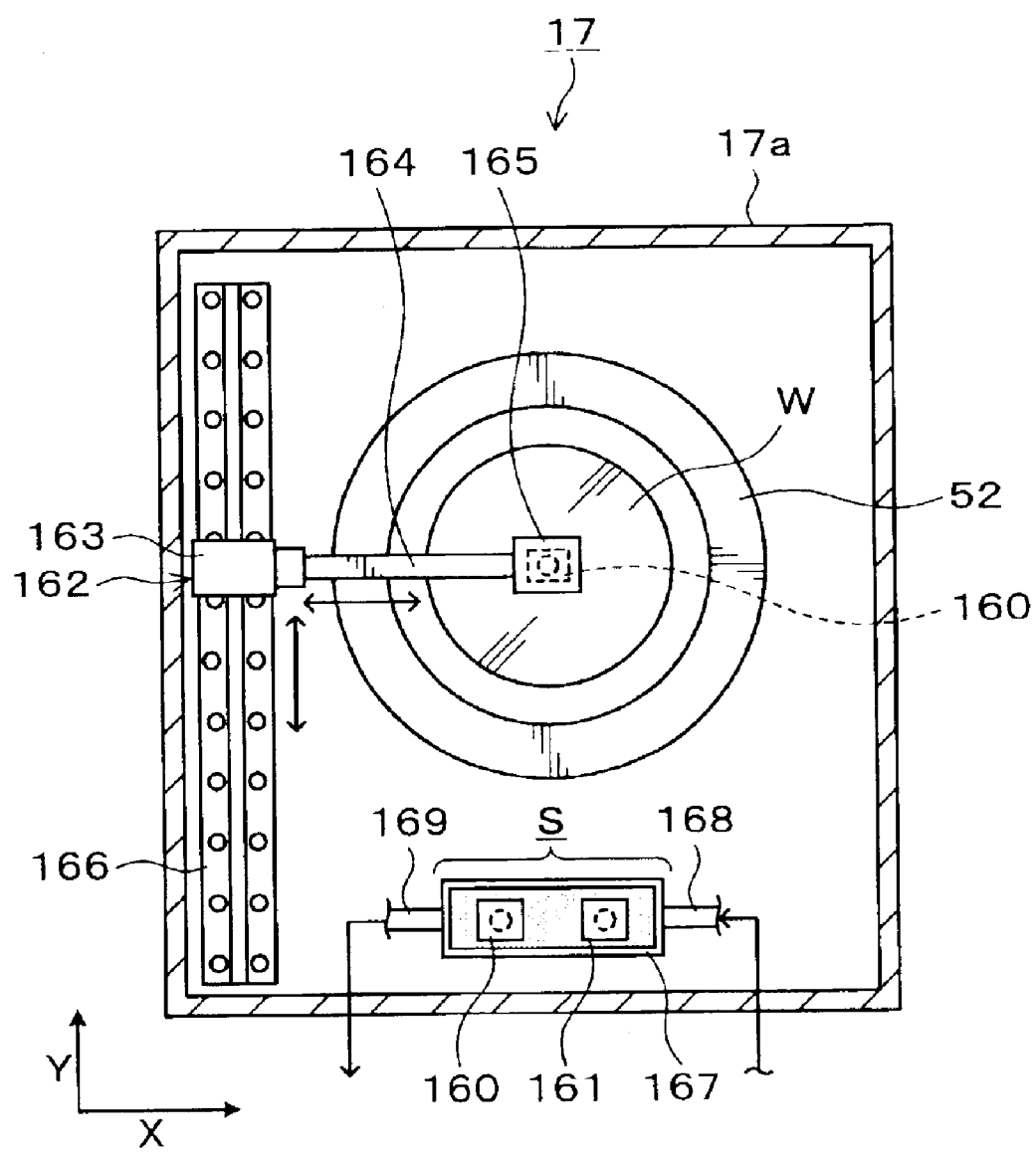
FIG. 15 is an explanatory view of a horizontal cross section schematically showing the configuration of the other example of the resist coating unit.

In this resist coating unit 17, two resist solution supply nozzles 160 and 161 are provided which supply the resist solution to the wafer W, for example, as shown in FIG. 15. The resist solution supply nozzles 160 and 161 are held by a nozzle arm 162 as shown in FIG. 14. The nozzle arm 162 is composed of a support post 163 extending, for example, in the vertical direction, a horizontal shaft 164 extending from the support post 163 in the horizontal direction, for example, in the X-direction, and a holding section 165 for holding the resist solution supply nozzles 160 and 161.

The support post 163 is capable of expansion and contraction in the vertical direction, for example, by a driving mechanism such as a cylinder or the like, and the horizontal shaft 164 is also capable of expansion and contraction in the horizontal direction, for example, by a driving mechanism such as a motor or the like. This allows the holding section 165 to be moved in the vertical direction and the X-direction. The holding section 165 is provided, for example with a removal mechanism (not shown) such a solenoid or the like, so that the holding section 165 can hold and remove the resist solution supply nozzle 160 or 161 at a predetermined timing.

As shown in FIG. 15, a rail 166 extending in the Y-direction is provided on the negative side in the X-direction (on the left side in FIG. 15) with respect to the cup 52 so that the nozzle arm 162 is provided to freely move on the rail 166 by a driving mechanism (not-shown). This permits the nozzle arm 162 to move from a later-described waiting section S of the resist solution supply nozzles 160 and 161 to the position above the cup 52, so that the nozzle arm 162 can carry the resist solution supply nozzles 160 and 161 within a section between the aforementioned positions.

In the waiting section S, for example, two resist solution supply nozzles 160 and 161 can wait. In the waiting section S, for example, a cleaning bath 167 is provided which stores a cleaning solution such as a thinner or the like. The cleaning bath 167 is provided with a cleaning solution supply pipe 168 for supplying the cleaning solution into the cleaning bath 167 and a drain pipe 169 for draining the cleaning solution and the like in the cleaning bath 167. A predetermined amount of the cleaning solution is stored in the cleaning bath 167 so that the resist solution supply nozzles 160 and 161 during waiting can be immersed in the cleaning solution. Further, it is also possible to perform pre-dispenses of the resist solution from the resist solution supply nozzles 160 and 161 into the cleaning bath 167 and drain the discharged resist solution via the drain pipe 169.

Figure 16:
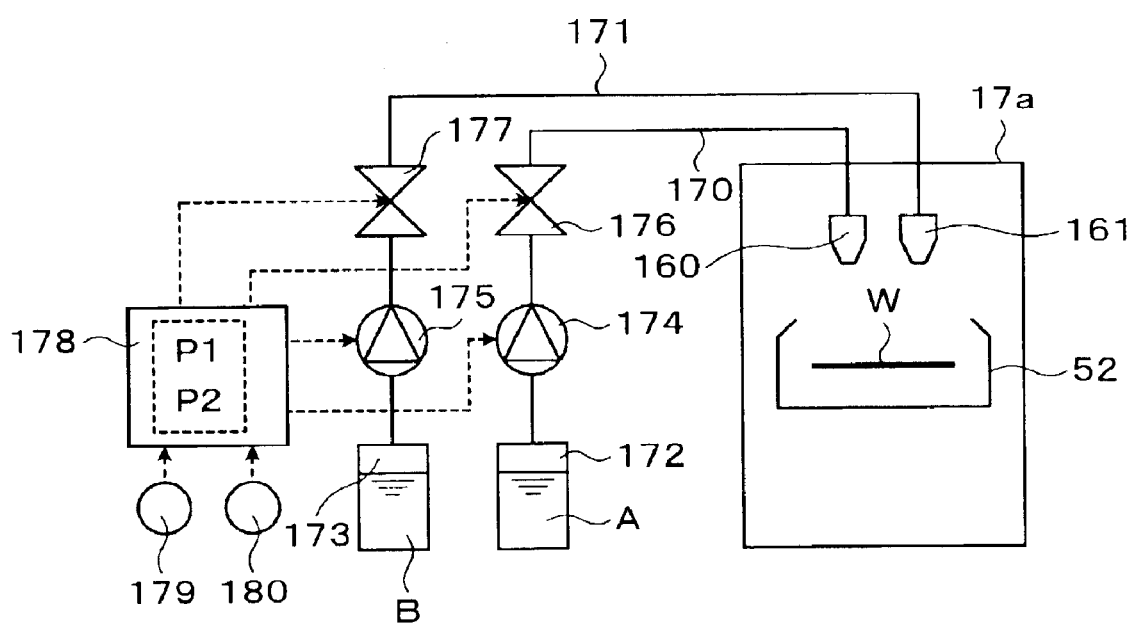
FIG. 16 is an explanatory view showing another configuration of a supply mechanism for resist solution supply nozzles.

The resist solution supply nozzles 160 and 161 are respectively connected to supply pipes 170 and 171 which are respectively communicated and connected with storage tanks 172 an 173 which are supply sources of the resist solution, for example, as shown in FIG. 16. The storage tank 172 stores a resist solution A, and the storage tank 173 stores a resist solution B. Therefore, the resist solution supply nozzle 160 discharges the resist solution A supplied from the storage tank 172 via the supply pipe 170, and the resist solution supply nozzle 161 discharges the resist solution B supplied from the storage tank 173 via the supply pipe 171.

The supply pipes 170 and 171 are respectively provided with pumps 174 and 175 for feeding by pressure the resist solutions to the resist solution supply nozzles 160 and 161, and adjusting valves 176 and 177 for controlling the discharge amounts of the resist solutions.

Actions of the pumps 174 and 175 and the adjusting valves 176 and 177 are controlled, for example, by a main controller 178. The main controller 178 can also control actions of other driving mechanisms of the resist coating unit 17, for example, the driver 57 and so on, thus controlling the entire resist coating unit 17. It should be noted that the main controller 178 is composed of a controlling unit (not shown) such as a CPU or the like, a storage unit (not shown) such as a RAM or the like, an input unit (not shown) for inputting set values and so on, an output unit (not shown) for outputting instruction signals to drivers, and so on.

The main controller 178 stores a treatment program P1 with treatment conditions set for the wafers W in every lot. The main controller 178 executes the treatment program P1 to thereby control the pumps 174 and 175, the adjusting valves 176 and 177, and so on for performance of a predetermined treatment for each lot.

The main controller 178 stores a determination program P2, for example, for determining whether to perform a pre-dispense of the resist solution. Through execution of the determination program P2, the main controller 178 determines to perform the pre-dispense when any one of the following conditions is satisfied, for example, the kind of the resist solution is changed between treatments for sequential lots (condition ①), a lapse time T from the completion of the treatment for the preceding lot exceeds a previously set allowed time $T_M$, for example, 600 sec (condition ②), and the number of treated lots N after the performance of the preceding pre-dispense exceeds a previously set allowed number of treated lots $N_M$, for example, 10 lots (condition ③). The main controller 178 determines to perform no pre-dispense when no condition is satisfied. When determining to perform a pre-dispense, the main controller 178 issues an instruction to operate the pumps 174 and 175 and so on for performance a pre-dispense.

The above condition ① that whether the kind of the resist solution is changed can be recognized, for example, from the set condition of the treatment program P1. Further, the main controller 178 includes, for example, a time measuring function 179 and a function of counting the number of treated lots 180 so that the lapse time T in the condition ② can be measured by the time measuring function 179, and the number of treated lots N in the condition ③ can be measured by the function of counting the number of treated lots 180. The function of counting the number of treated lots 180 is reset every performance of pre-dispense so that the count number is returned to zero.

To an upper face of the casing 17a, a duct 181 is connected which supplies the inside of the cup 52 with nitrogen gas, inert gas, air, or the like which is controlled in temperature and humidity and cleaned as shown in FIG. 14. This allows the gas to be supplied, for example, during the coating treatment of the wafer W and during the pre-dispense of the resist solution, so as to maintain a predetermined atmosphere in the cup 52.

Next, the method for treating the wafer W performed in the resist coating unit 17 configured as above will be described.

At the time of starting up the coating and developing treatment system 1, that is, at the time of starting treatment for the first lot, for example, a pre-dispense is performed for the resist solution A from the resist solution supply nozzle 160 used in the treatment for this lot. Then, the treatment program P1 is executed in the wafer treatment in each lot, so that the resist coating treatment is performed in accordance with the treatment program P1.

For example, before the wafer W is carried into the casing 17a, the air controlled at predetermined temperature and humidity is supplied from the duct 181 to maintain a predetermined atmosphere inside the casing 17a. In this event, the supplied air is exhausted to the outside of the resist coating unit 17 via the exhaust pipe 54.

When the wafer W is carried by the main carrier 13 into the casing 17a, the wafer W is delivered to the spin chuck 50, which has been raised, and suction-held on the spin chuck 50. Subsequently, the spin chuck 50 is lowered so that the wafer W is housed in the cup 52. Then, for example, the resist solution supply nozzle 160 waiting in the waiting section S is held by the nozzle arm 162 and moved to the position above the center portion of the wafer W in the cup 52.

When the resist solution supply nozzle 160 is located above the center portion of the wafer W, the main controller 178 issues an instruction to operate the pump 174 and the adjusting valve 176 so that the resist solution supply nozzle 160 discharges a predetermined amount of the resist solution A. Thereby, a predetermined amount of the resist solution A is supplied onto the center portion of the wafer W. Subsequently, the wafer W is rotated at a predetermined rotation speed, for example, 1500 rpm, and this rotation of the wafer W spreads the resist solution A over the front face of the wafer W. After the spreading of the resist solution is performed for a predetermined period so that the resist solution is spread over the entire front face of the wafer W, the rotation speed of the wafer W is increased to, for example, 2000 rpm to adjust the film thickness of the solution film of the resist solution on the wafer W.

After the adjustment of the film thickness, the rotation speed of the wafer W is decreased, for example, to 500 rpm. Then, the cleaning solution supply nozzles 55 supply a cleaning solution such as a thinner or the like to the rear face of the wafer W to clean the rear face of the wafer W. Thereafter, the supply of the cleaning solution is stopped, and the wafer W is kept rotated, for example, at 500 rpm so that the wafer W is subjected to dry processing.

After the completion of the dry processing of the wafer W, the rotation of the wafer W is stopped, and the wafer W is delivered from the spin chuck 50 to the main carrier 13 and carried out of the casing 17a, and a series of resist coating treatment of the wafer W comes to an end.

After the completion of the resist coating treatment of the wafer W, a subsequent wafer is immediately carried in, and subjected to the same treatment. In this manner, a predetermined number of wafers are treated one by one, and the treatment of this lot comes to an end.

Figure 17:
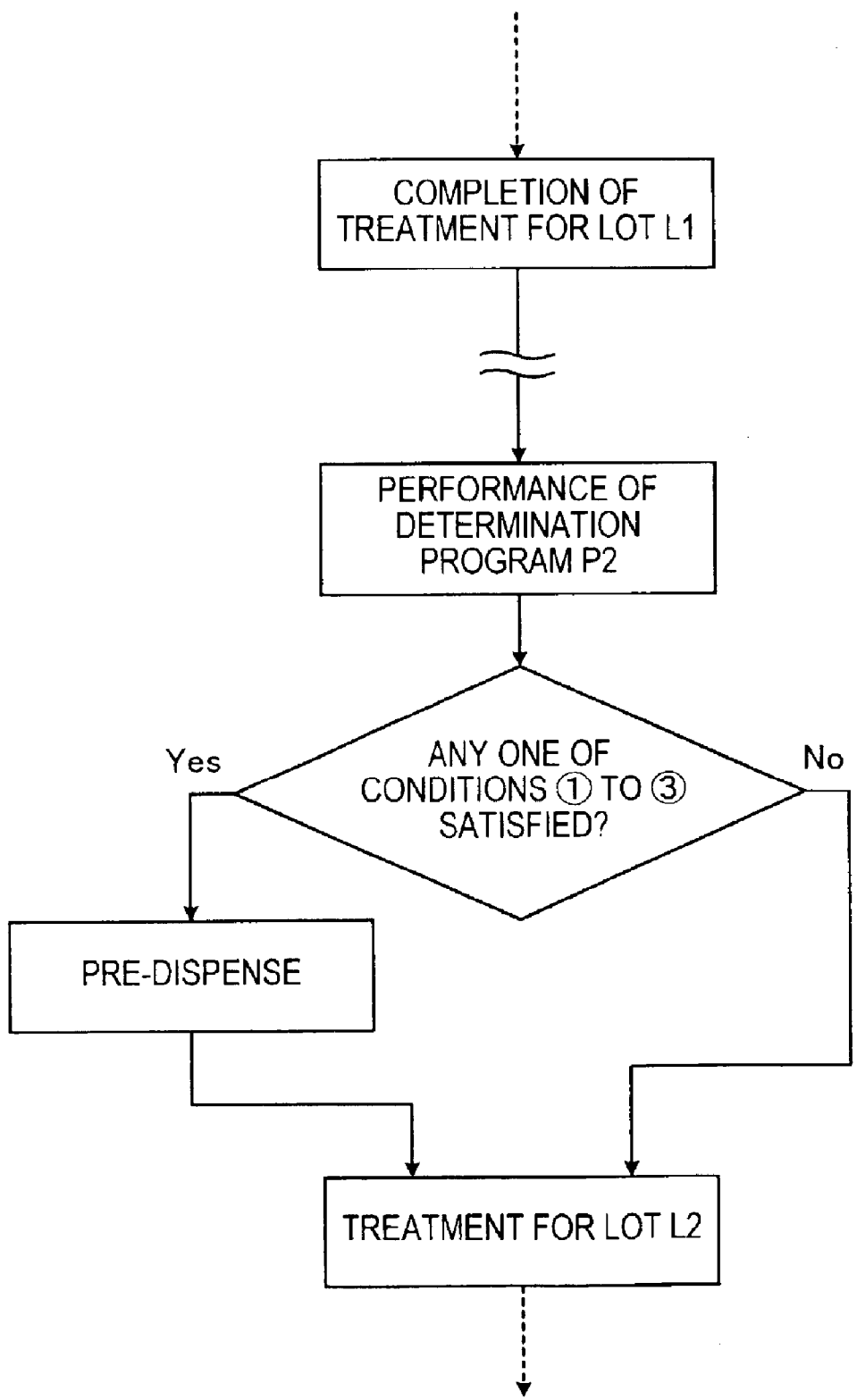
FIG. 17 is an explanatory view showing a flow of a treatment between treatments for lots.

After the completion of the treatment, for example, for a lot L1 as shown in FIG. 17, the time measuring function 179 starts measuring time. Then, immediately before the start of a treatment, for example, for a subsequent lot L2, the main controller 178 executes the determination program P2 to determine whether the above-described conditions ① to ③ are satisfied. More specifically, the following is determined, that is, whether the resist solution to be used in the subsequent lot L2 is the resist solution B different from the resist solution A for the lot L1, whether the lapse time T>the allowed time $T_M$, or whether the number of treated lots N>the allowed number of treated lots $N_M$. When any one of the conditions ① to ③ is satisfied, the pump 175 or 176 and adjusting valve 176 or 177 for the resist solution to be used for the subsequent lot L2 are operated to perform a pre-dispense of the resist solution before the subsequent wafer is carried into the resist coating unit 17.

In this event, the resist solution supply nozzles 160 and 161 are located in the cleaning bath 167, so that this pre-dispense is performed in the cleaning bath 167. Then, the time measuring function 179 and the function of counting the number of treated lots 180 are reset.

On the other hand, if any one of the above conditions ① to ③ is not satisfied, no pre-dispense is performed, for example, the execution of the determination program P2 is ended, and a treatment for the subsequent lot L2 is started. As described above, the main controller 178 executes the determination program P2 every completion of a treatment for one lot to determine whether the above-described conditions ① to ③ are satisfied. When any one of the conditions is satisfied, a pre-dispense is performed, and when none of the conditions is satisfied, no pre-dispense is performed.

According to the embodiment, since a pre-dispense is performed only when any one of the conditions ① to ③ is satisfied, the number of pre-dispenses can be reduced as compared to the prior art in which the pre-dispense is performed every change of lot. This results in reduced consumption of the resist solution. Since a pre-dispense is performed when the kind of the resist solution is changed between treatments for lots, a resist solution can be drained which has not been used in treatment for the preceding lot and has remained and deteriorated in the resist solution supply nozzle 160 or 161 and the supply pipe 170 or 171. This can prevent the resist solution changed in quality from being supplied onto the wafer W.

Besides, a pre-dispense is performed also when time of the allowed time $T_M$ has elapsed after the completion of the treatment for the preceding lot. In other words, a pre-dispense is performed also when there has been an idle time to the start of the treatment for the subsequent lot and thus the resist solution has remained and deteriorated in the resist solution supply nozzle 160 or 161 and the supply pipe 170 or 171. This can prevent the deteriorated resist solution from being discharged onto the wafer W. Further, a pre-dispense is performed also when the number of treated lots N after performance of the preceding pre-dispense exceeds the allowed number of treated lots $N_M$, so that the bubbles gradually accumulated, for example, in the pumps 174 and 175 can be eliminated to prevent the bubbles from being mixed in the resist solution during treatment. Note that it is also adoptable that, for example, in the case of treatment for one lot which normally has 25 wafers and when a lot having 12 wafers or less is included in the treatments for the successive lots, the lot having 12 wafers or less is counted as a ½ lot.

In this embodiment, the count of the number of treated lots N is reset every performance of pre-dispense, and as a result, the conditions ① and ② are not successively satisfied but the condition ③ is satisfied only when the number of treated lots N exceeds the allowed number of treated lots $N_M$. This eliminates performance of a pre-dispense based on the condition ③ immediately after performance of a pre-dispense based on the condition ①, resulting in reduced number of pre-dispenses.

Since a pre-dispense is performed at the start of the treatment for the first lot, the treatment can be performed using a desired resist solution from the treatment for the first lot.

The above embodiment describes two systems of resist solution supply pipes, but the number of nozzles is not limited to the above, and an arbitrary number (a plurality) of nozzles can be selected.

While, the condition ① is that the kind of the resist solution is changed between lots in the above embodiment, the condition ① may be that the number of rotations of the wafer W during a predetermined step in the resist coating treatment is changed between lots.

For example, as shown in FIG. 18, it is assumed that the resist coating treatment includes three steps, for example, Step S1 in which the wafer W is rotated, for example, at a first rotation number R1, for example, 2000 rpm so that the temperature of the front face of the wafer is made even; Step S2 in which the wafer W is rotated, for example, at a second rotation number R2, for example, 3500 rpm, and the resist solution is dropped onto the wafer W to form a resist film on the wafer W; and Step S3 in which the wafer W is rotated, for example, at a third rotation number R3, for example, 2500 rpm so that the resist film on the wafer W is stabilized and further the resist film is dried. Then, for example, the fact that the second rotation number R2 in Step S2 in the resist coating treatment is changed between lots may be regarded as the condition ①. This Step S2 is accompanied by spreading of the resist solution on the front face of the wafer W, and thus the rotation number R2 is determined by the viscosity of the resist solution and so on. The different kind of resist solution leads to a different viscosity of the resist solution and a different rotation number R2. Therefore, the object of determination for the condition ① is set not to the kind of the resist solution but to the rotation number R2 in Step S2 in the resist coating treatment, in which substantially the same effect can be attained. Note that in place of Step S2, the rotation number R1 or R3 in the other Step S1 or S3 may be made the object of determination for the condition ①.

The allowed time $T_M$ in the condition ② may be appropriately determined based on the viscosity of the resist solution in use, the kind of a solvent contained in the resist solution, a photosensitizer component, or the like. For example, deterioration times, drying times, or the like of a plurality of resist solutions are obtained by experiments to calculate appropriate allowed times in advance for the respective resist solutions. The appropriate allowed times are stored, for example, in the main controller 178 so that when the treatment program P1 is programmed, the shortest appropriate allowed time among a plurality of resist solutions for use in the treatment program is set in the determination program P2 as the allowed time $T_M$. The determination of the allowed time $T_M$ in accordance with the kind of the resist solution as described above permits a pre-dispense at an appropriate timing using any of the resist solutions, so as to prevent a deteriorated resist solution from being discharged onto the wafer W.

The allowed number of treated lots $N_M$ in the condition ③ may also be determined in accordance with the kind of the resist solution such as the viscosity of the resist solution in use, the kind of a solvent contained in the resist solution, or the like. Also in this case, correlations between various kinds of resist solutions and contamination at the tip portion of the resist solution supply nozzle are obtained by experiments or the like to calculate appropriate allowed numbers of treated lots in advance for the respective resist solutions based on the correlations. The appropriate allowed numbers of treated lots are stored, for example, in the main controller 178 so that when the treatment program P1 is programmed, the smallest appropriate allowed number of treated lots among a plurality of kinds of resist solutions for use in the treatment is set in the determination program P2 as the allowed number of treated lots $N_M$. This determines an appropriate allowed number of treated lots $N_M$ every time depending on the kind of the resist solution for use, resulting in performance of a pre-dispense at an appropriate timing.

While the condition ③ is that the number of treated lots N after performance of the preceding pre-dispense exceeds the allowed number of treated lots $N_M$ in the above embodiment, the number of treated wafers W may be used in place of the number of treated lots. In this case, the condition ③ is that, for example, the number of treated wafers after performance of the preceding pre-dispense exceeds the allowed number of treated wafers. In this case, the number of treated wafers is counted by a function of counting the number of treated wafers, so that when any one of the conditions ① to ③ is satisfied, a pre-dispense is performed. Then, the count of the number of treated wafers is reset every performance of pre-dispense.

While the conditions ① to ③ are selectively imposed as a condition for performance of a pre-dispense in the above-described embodiment, a pre-dispense may be performed when either the condition ① or the condition ② is satisfied, that is, the condition that the kind of the resist solution is changed between the treatments for sequential lots or the condition that the allowed time $T_M$ has elapsed after the completion of the preceding lot. Also in this case, since no pre-dispense is performed unless the kind of the resist solution is changed or the allowed time $T_M$ has elapsed, the number of pre-dispenses can be reduced. On the other hand, a pre-dispense is performed when necessary to prevent a deteriorated resist solution from being supplied to the wafer W, so that the resist coating treatment can be appropriately performed.

Further, it is also adoptable to perform a pre-dispense when either the condition ① or the condition ③ is satisfied, that is, the condition that the kind of the resist solution is changed or the condition that the number of treated lots N after performance of the preceding pre-dispense exceeds the allowed number of treated lots $N_M$. Also in this case, since no pre-dispense is performed unless the kind of the resist solution is changed or the number of treated lots N> the allowed number of treated lots $N_M$, the consumption of the resist solution can be reduced accordingly.

It should be noted that a pre-dispense may be performed only in the case of the condition ①, that is, when the kind of the resist solution is changed between the treatments for sequential lots. Also in this case, the number of pre-dispenses can be reduced as compared to the prior art, resulting in reduced consumption of the resist solution.

Figure 19:
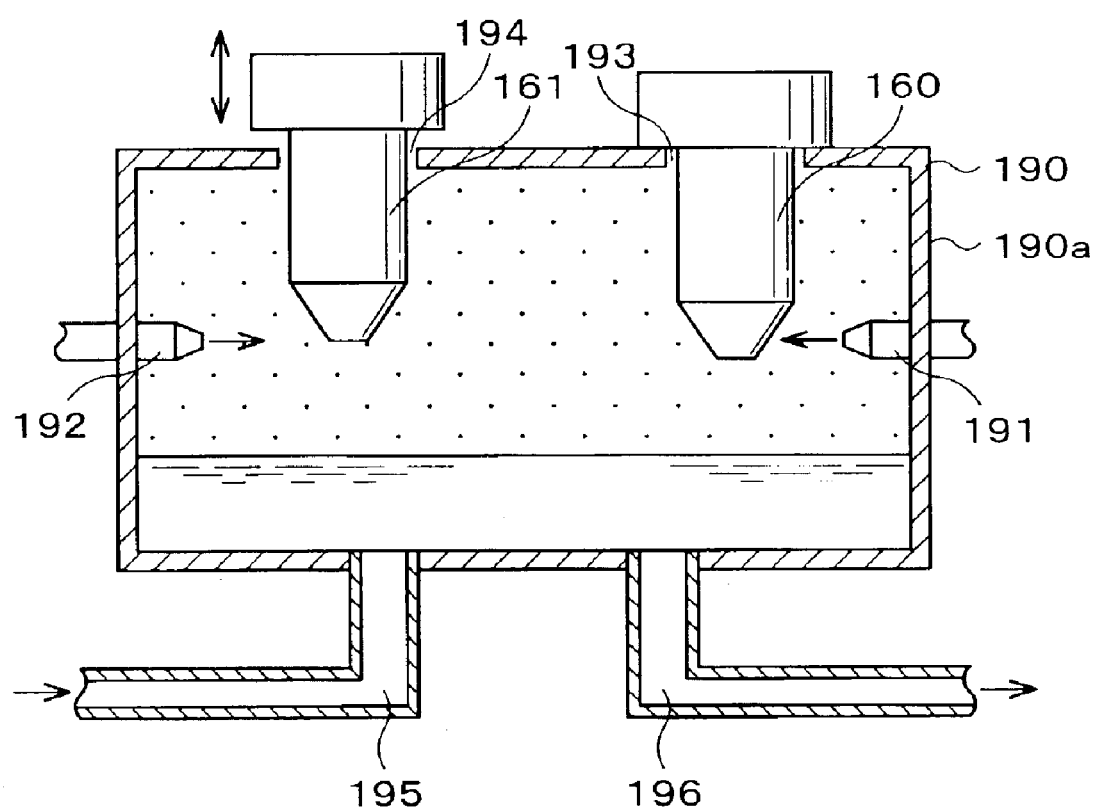
FIG. 19 is an explanatory view of a vertical cross section showing another example of the configuration of a cleaning bath.

As shown in FIG. 19, a cleaning bath 190 in the resist coating unit 17 may comprise, for example, a sealable case 190a and cleaning solution jet nozzles 191 and 192 for jetting a cleaning solution to the resist solution supply nozzles 160 and 161. The upper face of the case 190a is provided with insertion ports 193 and 194 for inserting the resist solution supply nozzles 160 and 161 into the case 190a. The lower face of the case 190a is provided with a cleaning solution supply pipe 195 for supplying the cleaning solution into the case 190a and a drain pipe 196 for draining the cleaning solution in the case 190a.

As for prevention of drying during waiting, a predetermined amount, for example, 5 cc to 20 cc of the cleaning solution is stored in the lower part of the cleaning bath 190 to form a volatile atmosphere of the cleaning solution in the upper portion of the cleaning bath 190 so that the resist solution supply nozzles 160 and 161 are housed in the volatile atmosphere. This allows the tip portions of the resist solution supply nozzles 160 and 161 during waiting to be exposed to the volatile atmosphere of the cleaning solution, thereby preventing the resist solution adhered to the tip portions of the resist solution supply nozzles 160 and 161 from drying.

Further, it is also adoptable to jet the cleaning solution from the cleaning solution jet nozzles 191 and 192 to the waiting resist solution supply nozzles 160 and 161, for example, immediately before performance of a pre dispense so as to clean and dissolve the resist solution adhered to the tip portions of the resist solution supply nozzles 160 and 161. Thereafter, a pre-dispense is performed, and then the cleaning solution in the cleaning bath 190 may be drained via the drain pipe 196, and a new cleaning solution is supplied from the cleaning solution supply pipe 195 to replace the cleaning solution in the cleaning bath 190. This permits the cleaning solution contaminated due to pre-dispenses and so on to be replaced with a new cleaning solution.

While the present invention is applied to the treatment method of performing a pre-dispense of the resist -solution in the above-described embodiment, the present invention is also applicable to a treatment method of performing pre-dispenses of other treatment solutions, for example, a developing solution, a cleaning solution, a coating solution for forming an interlayer insulating film, a treatment solution for use in the adhesion treatment, and so on. Further, the present invention is also applicable to a treatment method for substrates other than the wafer W, for example, an LCD substrate, a mask substrate, a reticle substrate, and so on.

The present invention is a substrate treatment method in which a treatment by supplying a treatment solution to a substrate is successively performed for a plurality of substrates, comprising the step of, during the performance of the successive treatments, performing between the treatments a plurality of pre-dispenses for different purposes of the treatment solution, wherein at least a recipe of the treatment solution to be pre-dispensed or a start condition of the pre-dispense is determined for each of the pre-dispenses.

Note that the "pre-dispense" in the present invention is a pre-dispense of the treatment solution. This pre-dispense includes not only draining the treatment solution remaining in the treatment solution supply mechanism to the outside thereof but also draining the treatment solution in the treatment solution supply mechanism to other parts in the same treatment solution supply mechanism. The "pre-dispense" is sometimes called also a "dummy dispense". Beside, the recipe includes, for example, setting of the discharge rate of the treatment solution.

Further, the present invention can also employ the following configuration. The configuration is such that an integrated time from the time of a preceding pre-dispense or the time of a preceding reset is measured for each of the pre-dispenses, that each of the pre-dispenses is performed when the integrated time reaches a predetermined set time, that the plurality of pre-dispenses are given priority levels, that when the pre-dispense at a high priority level is performed, the integrated time of the pre-dispense at a priority level lower than that is reset, and that when the pre-dispense at a low priority level is performed, the integrated time of the pre-dispense at a priority level higher than that is not reset.

The "time of a preceding reset" here means the time of a preceding reset of the integrated time which is continuously measured. Besides, the "predetermined set time" means a set time determined for each pre-dispense.

In the pre-dispense performed in the treatment for the substrate, performance of one pre-dispense may sometimes attain the purpose of another pre-dispense. For example, when a pump is operated to perform a pre-dispense of exhausting bubbles collecting in a filter, a pre-dispense of exhausting bubble gathering in the pump can also be performed at the same time. In this case, for example, the pre-dispense of exhausting the bubble in the filter is given a high priority level, and the pre-dispense of exhausting the bubble in the pump is given a low priority level.

When the pre-dispense at the high priority level is performed, the integrated time of the pre-dispense at the lower priority level is reset. Therefore, the performance of the pre-dispense of exhausting the bubbles in the filter omits the immediately subsequent pre-dispense of exhausting the bubbles in the pump, resulting in reduced total number of pre-dispenses. This can shorten the suspension time due to the pre-dispenses in the substrate treatment, and reduce the consumption of the treatment solution.

Note that as the criteria for giving priority levels, for example, the following can be suggested. As for pre-dispenses performed from the same draining unit, one needs to be performed frequently is given a high priority level, and one only needs to be performed infrequently is given a low priority level. In this case, the discharge amount of the treatment solution may be matched to the largest amount among the pre-dispenses which are given priority levels. Further, the priority levels may be given such that among pre-dispenses performed from the same draining unit, a pre-dispense with a larger discharge amount is given a high priority level, and a pre-dispense with a smaller discharge amount is given a low priority level. Moreover, the priority levels may be given such that a pre-dispense capable of attaining a plurality of purposes is given a high priority level, and a pre-dispense, whose purpose is attained by performance of the pre-dispense capable of attaining a plurality of purposes, is given a low priority level.

The same process may be executed using an integrated number of treated substrates in place of the integrated time. Also in this case, it is possible to omit unnecessary pre-dispenses to reduce the total number of pre-dispenses. Note that the "predetermined set number of treated substrates" means the set number of treated substrates determined for each pre-dispense.

Further, it is also adoptable that both the integrated time and the integrated number of treated substrates are employed, that each of the pre-dispenses is performed when the integrated time reaches a predetermined set time or when the integrated number of treated substrates reaches each set number of treated substrates, that when the pre-dispense at a high priority level is performed, the integrated time and the integrated number of treated substrates of the pre-dispense at a priority level lower than that are reset, and that when the pre-dispense at a low priority level is performed, the integrated time and the integrated number of treated substrates of the pre-dispense at a priority level higher than that are not reset.

Further, within the present invention, it is also adoptable that only a part of the plurality of pre-dispenses as described above are given priority levels, that the reset is not performed for the pre-dispense without a given priority level when all the other pre-dispenses are performed, and that the pre-dispense without a given priority level is performed only in accordance with its own start condition. This allows a pre-dispense whose start condition is independent of the other pre-dispenses to be set and performed.

Further, within the present invention, it is also adoptable that a plurality of pre-dispenses are placed at the same priority level, and that the reset is not performed for the pre-dispense placed at the same priority level when the other pre-dispense at the same priority level is performed. In this case, a plurality of pre-dispenses having independent start conditions can be set to the same priority level. This enables a pre-dispense to be set and performed while keeping its independence of the start condition from a certain pre-dispense and allowing start conditions of other pre-dispenses to depend thereon.

The present invention in another aspect is a substrate treatment method in which a treatment by supplying a treatment solution to a substrate is successively performed for a plurality of substrates, comprising the step of performing a pre-dispense of the treatment solution at a break between lots of the substrates, wherein the step of performing the pre-dispense is performed only when the kind of the supplied treatment solution is changed between the lots.

In this case, the pre-dispense step performed at a break between the lots of the substrates may be performed only when either condition is satisfied, a condition that the kind of the supplied treatment solution is changed between the lots or a condition that a predetermined time has elapsed after completion of the treatment for a preceding lot. The "treatment for a preceding lot" means the treatment for "a lot immediately before the break of lot."

If there is a long time from the completion of the treatment for the preceding lot to the start of the treatment for a new lot, the treatment solution in the treatment solution supply mechanism such as nozzles, supply pipes, and so on is susceptible to deterioration. Thus, performance of a pre-dispense also when a predetermined time has elapsed after the completion of the treatment for the preceding lot sufficiently ensures the quality of the treatment solution to be supplied to substrates.

The pre-dispense step performed at a break between the lots of the substrates may be performed only when either condition is satisfied, a condition that the kind of the supplied treatment solution is changed between the lots or a condition that the treatments for a predetermined number of lots are completed after performance of a preceding pre-dispense.

Performance of a pre-dispense also when the treatments for a predetermined number of lots are completed after performance of a preceding pre-dispense makes it possible to eliminate bubbles in the nozzle and supply pipe gradually accumulated, for example, by continuously supplying the treatment solution. This can prevent the bubbles from being contained in the treatment solution to be supplied to substrates.

The pre-dispense step performed at a break between the lots of the substrates may be performed only when any one of conditions is satisfied, a condition that the kind of the treatment solution is changed between the lots, a condition that a predetermined time has elapsed after completion of the treatment for a preceding lot, and a condition that the treatments for a predetermined number of lots or a predetermined number of substrates are completed after performance of a preceding pre-dispense.

Performance of a pre-dispense also when a predetermined time has elapsed after the completion of the treatment for a preceding lot makes it possible to prevent deterioration of the treatment solution to be supplied to substrates. Performance of a pre-dispense when the treatments for a predetermined number of lots or a predetermined number of substrates are completed after performance of a preceding pre-dispense makes it possible to drain bubbles in the nozzle and supply pipe accumulated, for example, by continuously supplying the treatment solution. This can prevent unnecessary substances such as bubbles and so on from being contained in the treatment solution to be supplied to substrates. Note that it is preferable that the preceding pre-dispense is the last performed one among pre-dispenses previously performed.

It is also possible to propose a method that the number of treated lots is counted to recognize the predetermined number in the condition, and that the count of the number of treated lots is reset every performance of the pre-dispense. This permits the count of the number of lots to be reset even when a pre-dispense is performed based on another condition such as charge of the kind of resist solution or the like. As a result, the pre-dispense based on the condition of the number of treated lots is regarded as has been performed, resulting in reduced frequency of pre-dispenses.

Further, it is also possible to propose a method that is a substrate treatment method in which a treatment by supplying a treatment solution to a substrate is successively performed for a plurality of substrates, comprising the step of performing a pre-dispense of the treatment solution at a break between the lots of the substrates, wherein the step of performing the pre-dispense is performed only when any one of conditions is satisfied, a condition that the kind of the supplied treatment solution is changed between the lots, a condition that a predetermined time has elapsed after completion of the treatment for a preceding lot, and a condition that a predetermined number of substrates have been treated after performance of a preceding pre-dispense.

According to the method, the pre-dispense is performed when the kind of the treatment solution is changed between the lots, so that the frequency of pre-dispenses can be reduced as compared to the prior art. Further, the pre-dispense is performed also when a predetermined time has elapsed after the completion of the treatment for a preceding lot, thereby making it possible to prevent deterioration of the treatment solution to be supplied to substrates. Further, the pre-dispense is performed also when a predetermined number of substrates have been treated after performance of a preceding pre-dispense, thereby making it possible to drain bubbles in the nozzle and supply pipe before a large amount of bubbles accumulated therein. This can maintain the same quality of the treatment solution to be supplied to substrates. It is also adoptable that the number of treated substrates is counted to recognize the predetermined number in the condition, and that the count of the number of treated substrates is reset every performance of the pre-dispense.

The pre-dispense may be performed also at the time of starting the treatment for the first lot. The pre-dispense can be performed before the time of starting the treatment for the first lot, for example, at the time of starting up the treatment unit for implementing the treatment method. This permits a desired treatment solution to be supplied to substrates from the treatment for the first lot for performance of an appropriate treatment.

What is claimed is:

1. A substrate treatment method in which a treatment by supplying a treatment solution to a substrate is successively performed for a plurality of substrates, comprising the step of:

during the performance of the successive treatments, performing between the treatments a plurality of pre-dispenses for different purposes of the treatment solution, wherein at least a recipe of the treatment solution to be pre-dispensed or a start condition of the pre-dispense is determined for each of the pre-dispenses and wherein the substrate treatment method is performed by a treatment apparatus by supplying the treatment solution to the substrate, the treatment apparatus including:

a treatment solution supply mechanism for supplying the treatment solution and performing a pre-dispense of the treatment solution; and a main controller for controlling the pre-dispense, wherein the main controller controls discharge amounts an start conditions of a plurality of pre-dispenses, wherein the main controller has a measuring unit, wherein the measuring unit measures an integrated time from the time of a preceding pre-dispense or the time of a preceding reset, for each of the pre-dispenses, and wherein the main controller conducts a control such that each of the pre-dispenses is performed when the integrated time reaches a predetermined set time, the plurality of pre-dispenses are given priority levels, when the pre-dispense at a high priority level is performed, the integrated time of the pre-dispense at a priority level lower than that is reset, and when the pre-dispense at a low priority level is performed, the integrated time of the pre-dispense at a priority level higher than that is not reset.

2. The substrate treatment method as set forth in claim 1, wherein the recipe is a set value of a discharge amount of the treatment solution.

3. The substrate treatment method as set forth in claim 1, wherein an integrated time from the time of a preceding pre-dispense or the time of a preceding reset is measured for each of the pre-dispenses, wherein each of the pre-dispenses is performed when the integrated time reaches a predetermined set time, wherein the plurality of pre-dispenses are given priority levels, wherein when the pre-dispense at a high priority level is performed, the integrated time of the pre-dispense at a priority level lower than that is reset, and wherein when the pre-dispense at a low priority level is performed, the integrated time of the pre-dispense at a priority level higher than that is not reset.

4. The substrate treatment method as set forth in claim 3, wherein only a part of the plurality of pre-dispenses are give priority levels, wherein the reset is not performed for the pre-dispense without a given priority level when all the other pre-dispenses are performed, and wherein the pre-dispense without a given priority level is performed only in accordance with its own start condition.

5. The substrate treatment method as set forth in claim 3,
wherein a plurality of the pre-dispenses are placed at the same priority level, and
wherein the reset is not performed for the pre-dispense placed at the same priority level when the other pre-dispense at the same priority level is performed.

6. The substrate treatment method as set forth in claim 1,
wherein an integrated number of treated substrates from the time of a preceding pre-dispense or the time of a preceding reset is measured for each of the pre-dispenses,
wherein each of the pre-dispenses is performed when the integrated number of treated substrates reaches a predetermined set number of treated substrates,
wherein the plurality of pre-dispenses are given priority levels,
wherein when the pre-dispense at a high priority level is performed, the integrated number of treated substrates of the pre-dispense at a priority level lower than that is reset, and
wherein when the pre-dispense at a low priority level is performed, the integrated number of treated substrates of the pre-dispense at a priority level higher than that is not reset.

7. The substrate treatment method as set forth in claim 6,
wherein only a part of the plurality of pre-dispenses are give priority levels,
wherein the reset is not performed for the pre-dispense without a given priority level when all the other pre-dispenses are performed, and
wherein the pre-dispense without a given priority level is performed only in accordance with its own start condition.

8. The substrate treatment method as set forth in claim 6,
wherein a plurality of the pre-dispenses are placed at the same priority level, and
wherein the reset is not performed for the pre-dispense placed at the same priority level when the other pre-dispense at the same priority level is performed.

9. The substrate treatment method as set forth in claim 1,
wherein an integrated time and an integrated number of treated substrates from the time of a preceding pre-dispense or the time of a preceding reset are measured for each of the pre-dispenses,
wherein each of the pre-dispenses is performed when the integrated time reaches a predetermined set time or when the integrated number of treated substrates reaches each set number of treated substrates,
wherein the plurality of pre-dispenses are given priority levels,
wherein when the pre-dispense at a high priority level is performed, the integrated time and the integrated number of treated substrates of the pre-dispense at a priority level lower than that are reset, and
wherein when the pre-dispense at a low priority level is performed, the integrated time and the integrated number of treated substrates of the pre-dispense at a priority level higher than that are not reset.

10. The substrate treatment method as set forth in claim 9,
wherein only a part of the plurality of pre-dispenses are give priority levels,
wherein the reset is not performed for the pre-dispense without a given priority level when all the other pre-dispenses are performed, and
wherein the pre-dispense without a given priority level is performed only in accordance with its own start condition.

11. The substrate treatment method as set forth in claim 9,
wherein a plurality of the pre-dispenses are placed at the same priority level, and
wherein the reset is not performed for the pre-dispense placed at the same priority level when the other pre-dispense at the same priority level is performed.

12. A substrate treatment method in which a treatment by supplying a treatment solution to a substrate is successively performed for a plurality of substrates, comprising the step of:
performing a pre-dispense of the treatment solution at a break between lots of the substrates,
wherein the step of performing the pre-dispense is performed only when the kind of the supplied treatment solution is changed between the lots and
wherein the substrate treatment method is performed by a treatment apparatus by supplying the treatment solution to the substrate, the treatment apparatus including:
a treatment solution supply mechanism for supplying the treatment solution and performing a pre-dispense of the treatment solution; and
a main controller for controlling the pre-dispense,
wherein the main controller controls discharge amounts and start conditions of a plurality of pre-dispenses,
wherein the main controller has a measuring unit,
wherein the measuring unit measures an integrated time from the time of a preceding pre-dispense or the time of a preceding reset, for each of the pre-dispenses, and
wherein the main controller conducts a control such that each of the pre-dispenses is performed when the integrated time reaches a predetermined set time,
the plurality of pre-dispenses are given priority levels,
when the pre-dispense at a high priority level is performed, the integrated time of the pre-dispense at a priority level lower than that is reset, and when the pre-dispense at a low priority level is performed, the integrated time of the pre-dispense at a priority level higher than that is not reset.

13. The substrate treatment method as set forth in claim 12,
wherein the pre-dispense is performed also at the time of starting the treatment for the first lot of the substrates.

14. A treatment apparatus for performing a treatment by supplying a treatment solution to a substrate, comprising:
a treatment solution supply mechanism for supplying the treatment solution and performing a pre-dispense of the treatment solution; and
a main controller for controlling the pre-dispense,
wherein, the main controller controls discharge amounts and start conditions of a plurality of pre-dispenses,
wherein the main controller has a measuring unit,
wherein the measuring unit measures an integrated time from a of a preceding pre-dispense or a time of a preceding reset, for each of the pre-dispenses, and
wherein the main controller controls in a manner such that each of the pre-dispenses is performed when the integrated time reaches a predetermined set time, the plurality of pre-dispenses are given priority levels, when the pre-dispense at a high priority level is performed, the integrated time of the pre-dispense at a priority level lower than that is reset, and when the pre-dispense at a low priority level is performed, the integrated time of the pre-dispense at a priority level higher than that is not reset.

15. A treatment apparatus for performing a treatment by supplying a treatment solution to a substrate, comprising:

a treatment solution supply mechanism for supplying the treatment solution and performing a pre-dispense of the treatment solution; and a main controller for controlling the pre-dispense, wherein, the main controller controls discharge amounts an start conditions of a plurality of pre-dispenses, wherein the main controller has a measuring unit, wherein the measuring unit measures an integrated number of treated substrates from a time of a preceding pre-dispense or a time of a preceding reset, for each of the pre-dispenses, and wherein the main controller controls in a manner such that each of the pre-dispenses is performed when the integrated number of treated substrates reaches a predetermined set number of substrates, the plurality of pre-dispenses are given priority levels, when the pre-dispense at a high priority level is performed, the integrated number of treated substrates of the pre-dispense at a priority level lower than that is reset, and when the pre-dispense at a low priority level is performed, the integrated number of treated substrates of the pre-dispense at a priority level higher than that is not reset.

* * * * *